United States Patent
Kondo et al.

(10) Patent No.: US 6,304,243 B1
(45) Date of Patent: Oct. 16, 2001

(54) LIGHT VALVE DEVICE

(75) Inventors: Kenichi Kondo; Kunihiro Takahashi; Hiroaki Takasu; Tsuneo Yamazaki; Atsushi Sakurai, all of Koto-ku (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 08/132,692

(22) Filed: Oct. 6, 1993

(30) Foreign Application Priority Data

| Oct. 12, 1992 | (JP) | 4-273023 |
| Oct. 15, 1992 | (JP) | 4-277269 |
| Oct. 19, 1992 | (JP) | 4-280326 |
| Oct. 19, 1992 | (JP) | 4-280327 |
| Nov. 6, 1992 | (JP) | 4-297195 |
| Sep. 20, 1993 | (JP) | 5-233594 |

(51) Int. Cl.[7] .................................................. G09G 3/36
(52) U.S. Cl. ........................................................... 345/100
(58) Field of Search ..................... 345/87, 90, 92, 345/94, 98, 100, 102, 103, 205, 206; 359/54, 55–61

(56) References Cited

U.S. PATENT DOCUMENTS

| Re. 33,882 | * | 4/1992 | Morozumi ............................. 345/95 |
| 4,281,324 | * | 7/1981 | Nonomura et al. ................... 345/103 |
| 4,500,388 | * | 2/1985 | Ohmura et al. . |
| 4,644,338 | * | 2/1987 | Aoki et al. ....................... 345/206 X |
| 4,685,769 | * | 8/1987 | Fukuma et al. ...................... 345/98 |
| 4,758,831 | * | 7/1988 | Kasahara et al. .................... 345/98 |
| 4,782,340 | * | 11/1988 | Czubatyj et al. ................ 345/205 X |
| 4,924,215 | * | 5/1990 | Nelson .............................. 345/102 X |

FOREIGN PATENT DOCUMENTS

| 0209836 | 1/1987 | (EP) . |
| 0382567 | 8/1990 | (EP) . |
| 0444621 | 9/1991 | (EP) . |
| 0474474 | 3/1992 | (EP) . |
| 0519744 | * 12/1992 | (EP) ................................ G09G/3/36 |

* cited by examiner

Primary Examiner—Amare Mengistu
(74) Attorney, Agent, or Firm—Adams & Wilks

(57) ABSTRACT

A highly integrated light valve is formed with a composite substrate formed of a quartz substrate and a monocrystalline silicon thin film layer bonded to the quartz substrate, in which an X driving circuit and a Y driving circuit are integrated utilizing very large scale integration processing. Driving electrodes are arranged in a matrix format on the composite substrate for providing signals output from the X driving circuit and the Y driving circuit to respective transistors and display pixel electrodes arranged at each intersection of the driving electrodes in the matrix. A control circuit for supplying timing signals to the X driving circuit and the Y driving circuit and a display data generating circuit for generating display data in order to display an image are also integrated on the composite substrate. A light source element driving circuit for driving a light source element is provided thereon for projecting a displayed image. A liquid crystal layer is sealed in a gap between the composite substrate and a second, opposed substrate with a sealing agent. The sealing agent is, for example, a resin which is stiffened by ultraviolet radiation and is supplied along a predetermined seal region. The present invention provides an improved structure for a light valve device having a high reliability, compact size, high pixel density and high resolution.

9 Claims, 34 Drawing Sheets

1031: SAMPLE HOLD CIRCUIT
1032: LOW-PASS FILTER
1035: SYNCHRONIZATION SIGNAL GENERATING CIRCUIT
1036: RGB COMVERTER CIRCUIT
1037: CLAMPING CIRCUIT
1038: A/D CONVERTER CIRCUIT
1301: SYNCHRONIZATION SEPARATION CIRCUIT
1302: PLL CIRCUIT
1008: Y DRIVING CIRCUIT

30: EL LIGHT SOURCE ELEMENT

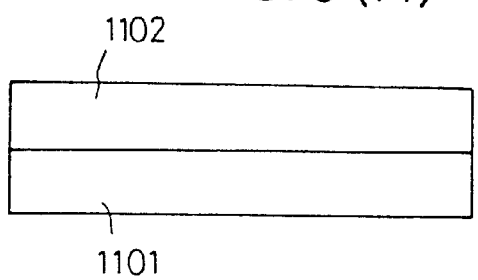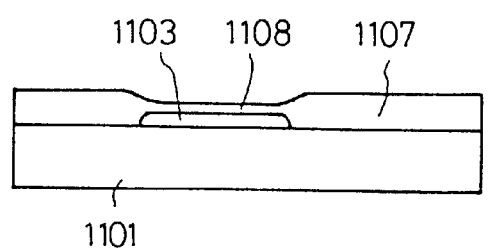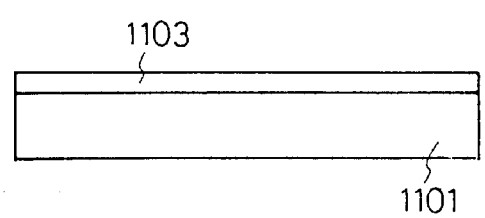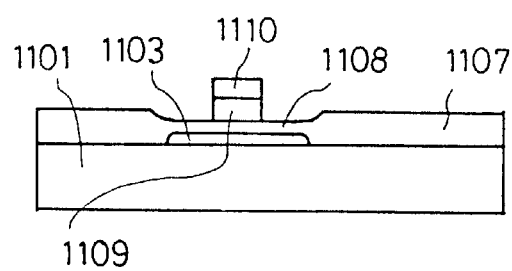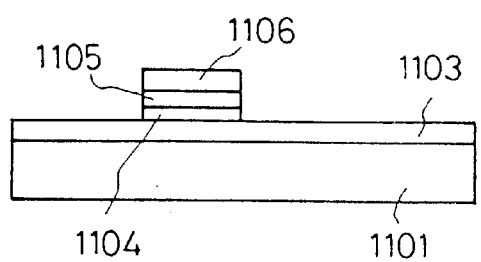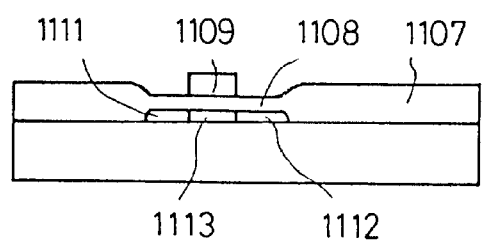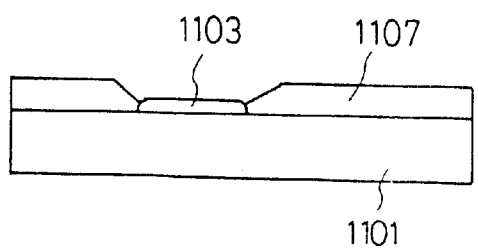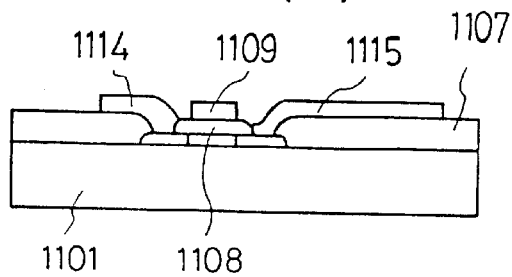

5075: SOLAR CELL
5080: VOLTAGE REGULATING CIRCUIT
5079: VOLTAGE DETECTING CIRCUIT
5083: PERIPHERAL CIRCUIT

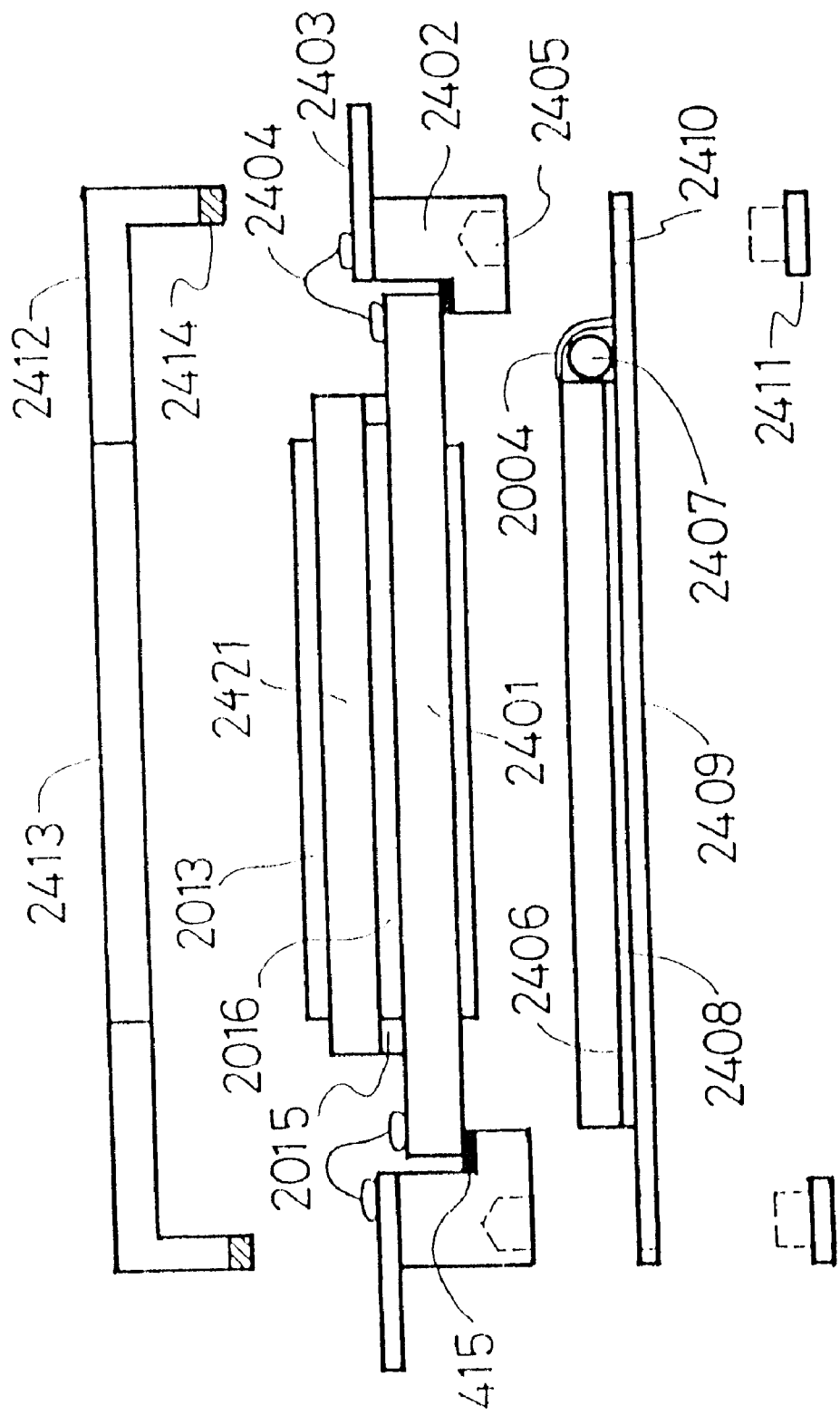

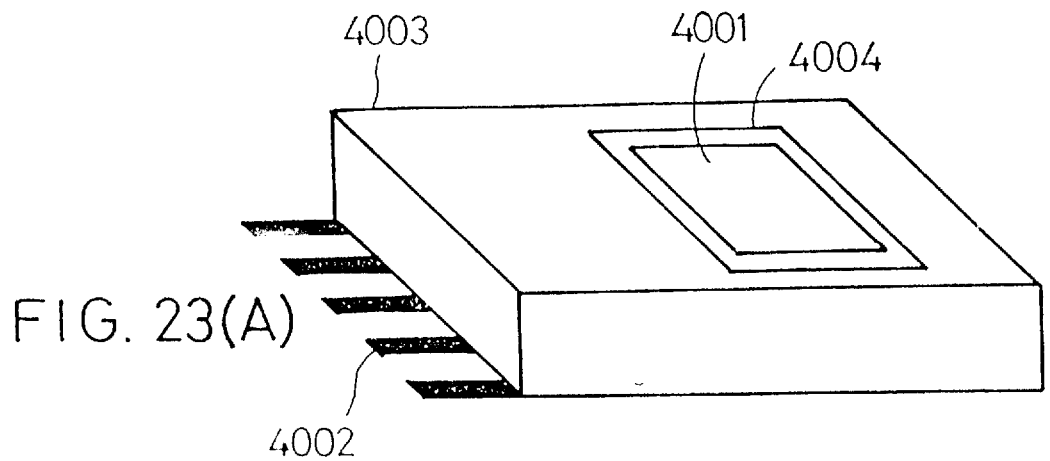
FIG. 23(A)
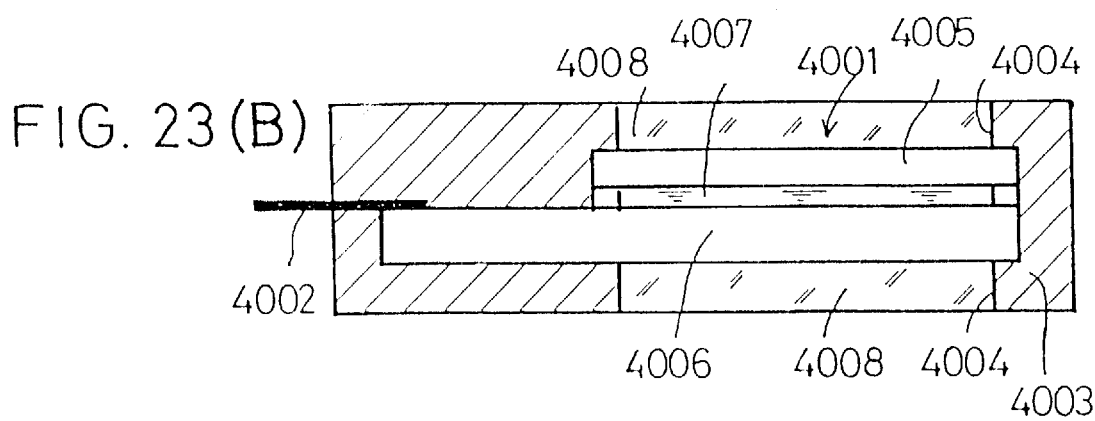
FIG. 23(B)
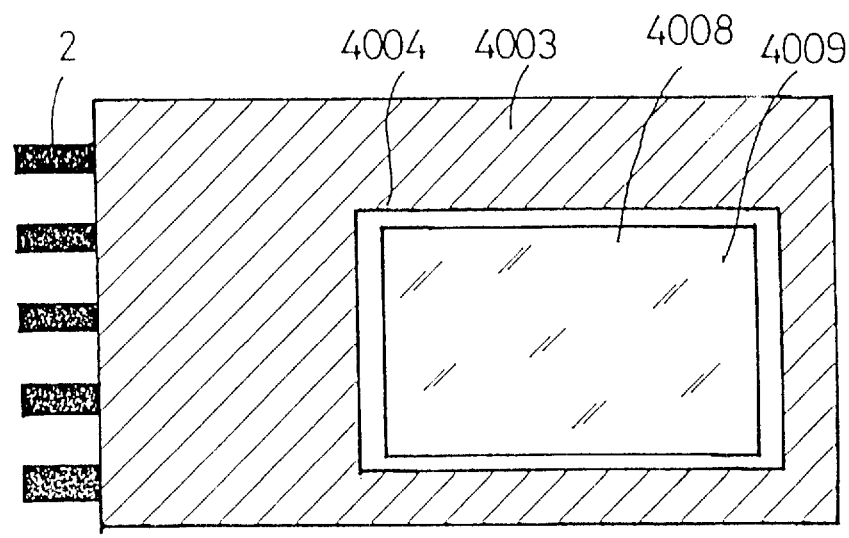

LIGHT VALVE DEVICE

BACKGROUND OF THE INVENTION

The present invention relates to active matrix type light valve devices using monocrystalline semiconductor layers as an active region, stereoscopic image display devices capable of observing image from the light valve devices provided on both eyes to obtain stereoscopic vision, and image projectors composed of a light source section, the light valve device, and a projection optical system.

Conventionally, the light valve devices of compact type image display devices used in view finders of the 8 mm video cameras are made by depositing polycrystal or amorphous silicon thin films on transparent electrically insulating substrates by vapor depositing or vapor phase epitaxy to form an individual-pixel switching element group and a X-Y electrode driving circuit group for driving such switching element group by the thin film transistors.

First, the conventional active matrix type liquid crystal display device is described referring to FIG. 40 for its general configuration. In the image display device of this kind, one quartz glass substrate 1001 and the other glass substrate 1012 are oppositely arranged each other and a liquid crystal layer 1016 is sealed between the substrates On a main surface of the quartz glass substrate 1001 is formed a film of a silicon polycrystal semiconductor layer 1002P, which constitutes an active region. A pixel array section 1017 and a peripheral circuit section are integrally formed on an inside surface of the quartz glass substrate 1001. The peripheral circuit section includes an X axis driving circuit 1006 and a Y driving circuit 1008. Matrix driving electrodes 1005 are formed on the pixel array section 1017 as orthogonally intersecting in the X axis direction and Y axis direction, and pixel electrodes 1010 are formed on intersecting points thereof. Switching elements 1009 are arranged corresponding to individual pixel electrodes 1010. The switching elements 1009 are composed of the thin film transistors (TFT) having the silicon polycrystal semiconductor layer 1002P as an active region. Drain electrodes thereof are connected to the corresponding pixel electrodes 1010, source electrodes thereof are electrically connected to the corresponding X axis matrix driving electrodes 1005, and gate electrodes thereof are electrically connected to the corresponding my axis matrix driving electrode 1005. The Y axis driving circuit 1008 selectively scans the matrix driving electrodes 1005 of the Y axis direction in lineal sequence. The X axis driving circuit 1006 is electrically connected to the matrix driving electrodes 1005 of the X axis direction and feeds display signals to the pixel electrodes 1010 through the selected switching elements 1009. A polarizer 1011 is bonded on an outer surface of the quartz glass substrate 1001.

A common electrodes 1014 are entirely formed on an inner surface of the other glass substrate 1012. A color filter with three original colors RGB is simultaneously formed for color display. A polarizer 1013 is bonded on outer surface of the glass substrate 1012. The substrate 1012 on the upper side is bonded to the quartz glass substrate 1001 on the down side by seal agent 1015. The seal agent 1015 is supplied along a seal region 1018 shown by dotted lines. The seal region 1018 is provided to embrace the pixel array section 1017, the peripheral circuit section composed of the X driving circuit 1006 and Y driving circuit 1008 are positioned outside the seal region 1018.

These amorphous silicon thin film and polycrystal silicon thin film are easily deposited on the glass substrate by chemical vapor phase epitaxy or like procedures, thus they are suitable for producing a an active matrix type liquid crystal display device having relatively larger display. The transistor elements formed into the amorphous silicon thin film or the polycrystal silicon thin film are generally of a field effect insulating gate type. Displays of approximately 3 inches to 10 inches are included in the active matrix type liquid crystal display devices using the amorphous silicon thin film which are commercially manufactured these days. The amorphous silicon thin film can be formed at a low temperature equal to or less than 350° C. and therefore it is suitable for a large-area liquid crystal panel. The active matrix type liquid crystal display device using the polycrystal silicon thin film is now produced which includes display of a picture size approximately 2 inches in the market.

However, the conventional active matrix type liquid crystal display device using the amorphous silicon thin film or the polycrystal silicon thin film is suitable for direct-view type display devices using relatively larger displays, however it is not always suitable for miniaturizing the devices and high density planning of the pixels. Recently, microminiature type display devices or light valve devices with a microminiature structure for device and high density for pixel are now increasingly in strong demand, other than the direct-view type display device. Such microminiature type light valve device is, for example, used as a primary image forming display of the image projector, and can be applied for the hi-vision type television of projection type. The application of the technique in producing fine semiconductors provides the microminiature type light valve device having a pixel size in the order of 10 $\mu$m and with an entire size of about several centimeters.

Some secondary problems arise in using the active matrix type liquid crystal display device as a light valve device of the projector. The drawbacks in the liquid crystal display device include damage of its light valve function due to temperature rise. In the projector, the light source intensively lights the transmission type liquid crystal display device to project the transmitted light forwardly through an enlargement optical system. Such intensive light from the light source is absorbed in the liquid crystal display device to cause temperature rise, thus if the temperature exceeds a critical point, the liquid crystal phase itself turns to be liquid and not liquid crystal any more.

The use of the active matrix type liquid crystal display device as a light valve device provides a drawback of a relatively lower brightness of the projected image. The pixel image accounts for a relatively too small ratio of space of the entire liquid crystal panel surface to provide a sufficient opening ratio. This prevents a brightness of the projecting image from increasing because of low utilization efficiency of the light. In addition, the polarizer which absorbs light is generally bonded on the liquid crystal panel, therefore the transmitted light amount decreases. Therefore, the use of the liquid crystal panel as a light valve device disadvantageously causes a lower utilization-efficiency of the light.

Conventionally, the light source is used only for lighting the light valve device, and is not intended for other utilizations. The projector requires an intensive light source capable of large amount of energy radiation, however such energy itself is almost lost uselessly. Thus, a problem arises that larger is given the projector power supply.

Using parallax of both eyes has conventionally been proposed to view stereoscopicaly image. For examples, (1) images for the left eye and right eye are separately picked up using two cameras, and projected alternatively on a monitor or a screen by switching from one image to the other, a liquid crystal shutter device is used to alternatively turn ON or OFF the left eye and the right eye in synchronization with the switching period of the projected images, thus the left eye watches the image prepared for the left eye and right eye watches the image prepared for the right eye to view stereoscopically image, and (2) image display elements are arranged separately in front of both eyes to display different images for each of the both eyes, thus a method of stereoscopic view is provided.

However, the conventional amorphous or polycrystal silicon thin film hardly operates at a high speed because of its lower driving current due to its monocrystalline material, it is impossible to form a sub-micron order of transistor elements even by applying the microminiature semiconductor technique. For example, a mobility of the amorphous silicon thin film is about 1 $cm^2$/Vsec, this prevents the peripheral circuit requiring a high speed operation from forming on the same substrate. In using the polycrystal silicon thin film, crystal particles have each size of approximately several $\mu$ to correspondingly limit the fine planning process for the transistor elements. Accordingly, in the conventional compact size image display devices using the polycrystal or amorphous silicon thin films, it is extremely difficult to realize integration density and high speed operation similar to those of the ordinary semiconductor integrated circuit elements.

The transmission type panels such as view finders require the light source elements, but the active elements of these driving circuits need to be composed of discrete parts because of requirements for a high withstand voltage and large current driving. Hence, it is difficult to produce, an integrated unit as a display device containing the light source elements which is a problem in realizing compact size and convenience on utilization.

There are limitations such that, in view of an electrical performance, it is impossible to assemble both the control circuit for supplying timing signals to the peripheral circuit section (for example, driving circuit) necessitating the high speed operation and the driving circuit for the light source elements together on one substrate, while in view of a integration density, the increase in size prevents the other peripheral circuits from incorporating therein. For this reason, in the present situation, it is impossible to assemble the peripheral circuit section, other than the pixel array section and the driving circuit group thereof on one substrate.

In view of the conventional problems mentioned above, the present invention is display elements for a compact size image display device in which a switching element group for selectively supplying electricity to the pixel and a highly integrated peripheral circuit capable of operating with high speed are formed on one substrate, and the peripheral circuit includes a driving circuit capable of driving the light source elements with a high withstand voltage and large current. The present invention provides an improved reinforced structure of the light valve device with high reliability, high utility convenience, microstructure, high density and high accuracy by integrating the light source elements and the display elements into a unitary structure. In particular, another object is to provide a packaging construction of a light valve device with a high grade in compact size, solidity, easy handing, reliability, light shielding, cooling, and assembling. Further another object is to improve an image reproducing quality by preventing attenuation of the display signals. Still another object is to improve image to be highly fine by saving display data transfer speed in respect of circuit and increasing the number of matrix driving electrode groups correspondingly. In addition, further another object is to provide a fine and highly accurate display devices suitable for the view finders and the like by reducing of outer sizes of the flat panels.

In the methods of stereoscopic view described in the prior art, method (1) has a problem in tiring the eyes due to a flickering image method (2) constitutes display elements using the transparent substrate formed of the pixel array section and the driving circuit on the polycrystal silicon thin film. In view of an electrical performance, it is impossible to assemble both the control circuit for supplying timing signals to the peripheral circuit section (for example, the driving circuit) necessitating the high speed operation, and the driving circuit for the light source elements together on the same substrate, while in view of an integration density, the increase in size prevents the other peripheral circuits from incorporating therein. For this reason, in the present situation, it is impossible to assemble the peripheral circuit section other than the pixel array section and the driving circuit group thereof on one substrate. Hence, the peripheral circuits other than the driving circuits require to be formed on the external circuits. Moreover, image data generated by the external circuits, and timing signals both must be connected by wires, where inconvenience arises in handling and operating. A space is required for disposing light source elements for irradiating the display elements and the pixel array section of the display elements from the back-side thereof, this causes a problem of thinner construction.

SUMMARY OF THE INVENTION

To solve the problems hereinbefore described, the present invention comprises at least a transparent electrically insulating substrate and a semiconductor monocrystalline thin film regulating a peripheral circuit area arranged in at least a part of the substrate surface. A pixel array area is provided in adjacent with the peripheral circuit area, A pixel electrode group and a switching element group for selectively supplying electricity to the each pixel electrode is provided. The switching element group is driven by X and Y driving circuits. There are similarly included a control circuit for supplying timing signals to the X and Y driving circuits, a display data generating circuit for generating display data, and a receiving circuit for receiving image data through radio communication. These peripheral circuit and driving circuit switching element group are integratedly formed, for example, using a very-large-scale integrated circuit (VLSI) manufacturing technique.

To produce the compact type image display device of such structure, semiconductor monocrystal, for example, a high quality of silicon monocrystalline wafer ordinarily used for forming VLSI, is bonded on the transparent electrically insulating substrate, this wafer is mechanically or chemically abraded to produce a semiconductor thin film on an entire surface of the substrate. The semiconductor monocrystalline thin film is selectively processed by VLSI producing technique to form a first transparent substrate which is formed of switching elements, X and Y driving circuits, a control circuit and a light source element driving circuit for driving light source elements. Next, the second transparent substrate composed of the transparent electrically insulating substrate arranged with the common electrode is provided in the region opposed to the pixel array group formed on the first transparent substrate, the electrooptic material is sealed into a gap between the first and second substrates to constitute the display elements. Electro-luminescence elements (EL element), fluorescence lamp elements (FL element) and the like as a light source element of the display elements are disposed on the backside of the display elements to mount them inside of a tightly sealed unit structure integrally.

According to one embodiment of the present invention, the display data generating circuit includes a RGB conversion circuit for converting composite video signals into RGB display signals and a synchronous separation circuit for separating synchronizing signals from the composite video signals. The control circuit generates the timing signals depending on the synchronizing signals. According the other embodiment, the driving circuit section includes two sets of X driving circuits and one set of Y driving circuits. The two set of X driving circuits are arranged separately upper and lower relative to the pixel array section, and operated parallely each other in accordance with the predetermined timing signals. On the other hand, the Y driving circuit, control circuit, and display data generating circuit are arranged separately on left and right to the pixel array section. According to further another embodiment of the invention, the display data generating circuit includes an A/D converter circuit for converting analog display signals temporarily into digital display data. The driving circuit section includes a D/A converter circuit for re-converting the digital display data into the analog display signals. According to still another embodiment the pair of substrates are bonded each other by a seal region provided along the peripheral portion of the substrates. This seal region is arranged to overlap lively with the peripheral circuit section including the driving circuit section, the control circuit, the display data generating circuit.

The present invention is to provide an improved structure of a light valve device with a microminiature size, high density and high accuracy. Particularly, an object is to provide the mount structure of the light valve device superior in size, solidity, handling, reliability, light shielding, cooling, and assembling and like factors. To achieve such objects, an IC package type monocrystalline semiconductor light valve device has been invented. The light valve device according to the invention has an IC package structure in which light valve cells, connector terminals, and package members are formed into a unitary shape. The package members embrace the light valve cells to enhance them physically, and possess a structured portion for shielding a window section matching to the pixel array section and the peripheral circuit section. The connector terminals have one end electrically connected to the peripheral circuit section of the light valve cells and the other end protruding from the package member.

The package member may preferably be made of black molded resin product, otherwise the package member may be formed of ceramic mold product. The window section of the package member is attached in unitary shape with a protecting glass member. According to one embodiment of the present invention, the package member has the same thickness as that of the light valve cell. The package member is provided on its external surface with heat radiating fins, or the window of package member is attached with an infrared ray filter for cutting heat ray. The infrared ray filter is laminated sometimes on the polarizer disposed apart from the light valve cell. According to another embodiment, the package member has a through hole to be a flow path of coolant. For a particular embodiment, the package member is provided.with a recess portion for detachably holding the light valve cell.

The connector terminals are disposed in parallel with the light valve cell and in a manner of protruding from the lateral end surface of the package member. Otherwise, the connector terminals may preferably be arranged in orthogonal to the light valve cell and in a manner of protruding from the main surface of the package member.

An object of the present invention is to provide a projector light valve device having a high density and high accuracy with a compact size. In addition, an object is to provide a cooling structure effectively suppressing temperature rise of the light valve device. Another object is to improve a lightness of the projecting images. Further, an object is to provide a possibility of effectively utilizing light source energy. To achieve the objects, various counter measures are taken as undermentioned. The projector according to the invention includes as a basic constituent element a light source section, a light valve device, and a projection optical system. The light valve device includes a pair of transparent substrates disposed opposingly each other, and an electrooptic material arranged between the substrates. On one transparent substrate, a pixel array section and a peripheral circuit section for driving that section are provided. The other transparent substrate is provided thereon with a counter electrode. As a feature of the present invention, the peripheral circuit section is integratedly formed on the monocrystalline semiconductor layer provided on the one transparent substrate.

Preferably, the pixel array section includes a pixel electrode group arranged in matrix shape and a switching element group for selectively power supplying to individual pixel electrodes, and at least, one of the transparent substrates includes a light-reflective shield film for shielding individual switching elements from incident light. Preferably, a solar cell is integrally formed on the semiconductor layer to photoelectrically convert incident light and to directly supply a power supply voltage to the peripheral circuit section. More preferably, the light valve device includes a micro-lens array to converge the incident light and to selectively light the pixel electrode group contained in the pixel array section. The micro-lens array is adhered on one of the transparent substrate through a transparent adhesion layer having a smaller refractive index compared there with. In addition, the light valve device preferably includes a cooling means, which concretely is composed of a container for containing the light valve device, and provided with an inlet for introducing compressed gas and an outlet for discharging decompressed gas to cool the device by means of adiabatic expansion. Or, the cooling means includes a fan for sending cooling gas to the light valve device. Or, the cooling means is composed of the container for containing the light valve device and a cooling system connected to the container and for supplying cooling gas. The cooling system is provided with an automatic temperature control arrangement. A supply port and a discharge port of the cooling system are provided together on lateral surface of the container.

In the display device as constructed above, a substrate with a double layered structure composed of an insulating substrate and a semiconductor monocrystalline thin film formed thereon is used and the semiconductor monocrystalline thin film layer has the same quality as that of a wafer formed of semiconductor monocrystalline bulk. Accordingly, the VLSI manufacturing technique is used to integrate switching elements, and a driving circuit for driving the pixels and peripheral circuits such as a receiving circuit, at ordinary electric performance with a high density, high withstand voltage, and large current driving. In addition, the display elements and the light source elements are made unitary to produce a display device which constitutes a stereoscopic vision display device for binocular, thus a wireless stereoscopic view image display device of a compact size can be provide.

Further in this construction, a video signal processing function and the like can be added to a flat panel device and is suitable for a view finder and the like of the video cameras. The peripheral circuit employs a digital type, and not the conventional analog type. Thus, the analog video signals are converted into the digital display data for data processing or data transfer, thereafter at a final stage, the digital display data is re-converted into the analog display signals to drive the pixel array section, hence an excellent image reproducibility is secured without attenuation of display signals. The VLSI manufacturing technique is used to parallelly operate using the driving circuit as a split structure and to decrease driving frequency, thus, correspondingly the number of matrix driving electrodes can be increased to achieve highly accurate images. Moreover, the peripheral circuit section is disposed on periphery of the pixel array section in the center and the seal region is arranged so as to overlay the peripheral circuit section, there can be obtained a highly integrated multi-functional compact image display device in which a center of the display picture is substantially coincident with the center of the flat panel.

According to the present invention, the light valve cell is constituted using the monocrystalline semiconductor layer to integrate and form the peripheral circuit section and the pixel array section into a unitary shape with a high density, thus a microminiature type highly precise light valve cell can be obtained. The light valve cell, the connector terminals, and the package member are integrally formed to provide a IC package construction. Therefore, as in the ordinary IC device, it is extremely easy to handle and is readily assembled into the circuit substrate and the like. In addition, a high grade of solidity, compact size, and reliability are provided because of mold products, and moreover, a shielding effect and cooling effect are given depending on requirement to be suitable for the projector.

According to the invention, the transparent substrate having the monocrystal semiconductor layer is used to form integration of the projector light valve device. The peripheral circuit section for driving the pixel array section is integratedly formed on the monocrystalline semiconductor layer. It is of course possible to form also the pixel array section on the monocrystal semiconductor layer. The monocrystalline semiconductor layer has a high uniformity of crystal and is thermally stable, thus processing at a high temperature can freely be performed to produce the fine structured monocrystalline transistor element, simultaneously since it has a larger carrier mobility compared to the polycrystal semiconductor layer or amorphous semiconductor layer, the transistor element with a high speed response can be obtained. Therefore, compared to the conventional example, the projector light valve device with a compact size, high performance, high density, and high accuracy is produced. The video signal processing circuit and the like in addition to the driving circuit can be added to the peripheral circuit section according to the circumstances.

In addition to the foregoing basic operation, various devices are intended. For example, the light reflection shielding film is formed on the transparent substrate for shielding the individual switching elements from the incident light. The light reflection shielding film not only prevents light leakage of switching elements but also suppresses temperature rise of the light valve device because of reflecting the incident light. The solar cell is integrally formed on the monocrystalline semiconductor layer to enable a self-sufficient power supply voltage and to intend effective energy utilization for the peripheral circuit section. The light valve device contains the micro-lens array, and only the pixel electrode portion is selectively lighted to improve a utilization efficiency of the light from the light source, The light valve device includes the cooling means to effectively suppress temperature rise.

BRIEF DESCRIPTION OF THE DRAWINGS

FIGS. 9(A) to 9(H) are process of producing the monocrystalline semiconductor type image display device according to the invention;

FIG. 22 is a sectional view showing a stereoscopic image display device of the invention;

FIGS. 23(A) to 23(C) are schematic diagrams showing a basic construction of an IC package type monocrystalline semiconductor light valve device according to the present invention;

DETAILED DESCRIPTION OF THE PREFERRED EMBODIMENTS

Figure 1:
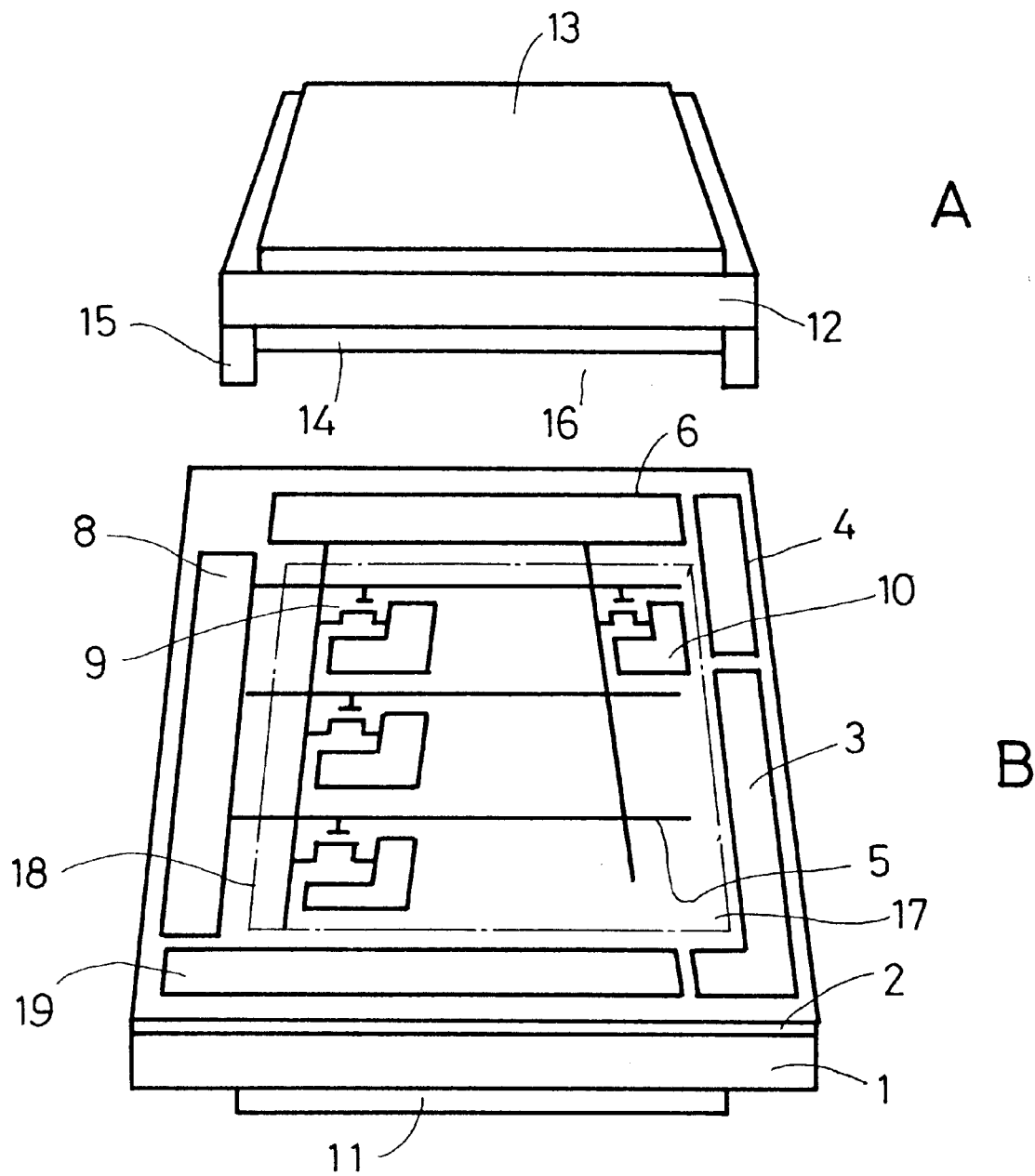
FIG. 1 is a perspective view showing one embodiment of the present invention.

FIG. 1 is a perspective view of a compact type image display device for illustrating an embodiment according to the present invention.

In FIG. 1, on a quartz glass substrate 1, and a monocrystalline silicon thin film 2 adhered on the quartz glass substrate 1, are formed an X driving circuit 6 and a Y driving circuit 8 formed into an integrated circuit by VLSI processing each driving electrode 5 formed in matrix shape for introducing output signals of the X driving circuit 6 and Y driving circuit 8, transistors 9 and display image electrodes 10 arranged at intersecting points of the driving electrodes 5 in matrix shape, a control circuit 4 for supplying timing signals to the X driving circuit 6 and Y driving circuit 8, and a display data generating circuit 3 for generating display data for image displaying; and further a light source element driving circuit 19 for driving light source elements is arranged. The configuration further comprises a first transparent substrate in which a polarizer 11 is adhered on backside of the quartz glass substrate 1, and a second transparent substrate in which a polarizer 13 is adhered on backside of a glass substrate 12 provided with a common electrodes 14. A liquid crystal layer 16, which is provided between the first substrate and the second substrate, is sealed by seal agent 15. The Y driving circuit 8 is disposed on left-side to a pixel array section 17, the control circuit 4 and the display data generating circuit 3 are disposed on right-side.

In FIG. 1, the display data generating circuit 3 inputs imaging signals.of a CCD image pick-up device and the like for picking up an image of the object, and outputs display data for image displaying by an incorporated A/D conversion circuit to the X driving circuit 6. The control circuit 4 inputs horizontal synchronization signals and vertical synchronization signals separated from composite signals from the CCD image pick-up device.

The control circuit 4 receives a horizontal synchronization.signals and a vertical synchronization signals to output timing signals necessary for display to the X driving circuits 6 and the Y driving circuit 8. The X driving circuit 6, incorporates 4 bit display data composed of A/D converted video signal from the display data generating circuit 3, which are sequentially shifted to an incorporated 4 bit parallel shift register circuit in synchronous with the timing signals of the control circuit 4 (shift clock signals of display data).

When the display data corresponding to the amount of one line is taken in, data corresponding to the amount of one line are latched by an incorporated latch circuit using the timing signals (data latch signals). The display data thus latched are converted into analog signals by an incorporated DIA conversion circuit to be output to each source of transistors in the pixel array section 17. Simultaneously, to select one scanning line, the Y driving circuit 8 outputs selected voltage to one driving electrode, to turn ON each gate of the transistors and to supply an output voltage of the X driving circuit 6 to the display pixel electrode.

The liquid crystal layer 16 provides pixel display with a variable density depending on amplitude voltage applied to the common electrode 14 and the display pixel electrode 10. Thus, the Y driving circuit 8 and the X driving circuit 6 display the image signals picked-up onto the image array section 17 by linearly sequentially driving. It is understood that electrooptic materials are not limited into liquid crystal, the foregoing and other fluid materials or solid materials can suitably be used therein. In this example, a pair of substrates 1 and 12 constituting the flat panel construction are formed of glass material, which is light transmission type. However, the present invention is not limited to the above example notwithstanding, at least one-side thereof may preferably be transparent.

The liquid crystal layer 16 is sealed in a gap between the first transparent substrate and the second transparent substrate by a seal agent 15. The seal agent 15 is made, for example, from bonding agent resin of ultraviolet hardening type, and applied along a predetermined seal region 18 as shown by dotted lines. The seal region 18 is defined so as to overlap the peripheral circuit section embracing the pixel array section 17 positioned at the center, and this enables a compact mount on the flat panel. It is unnecessary to provide particular zone between the pixel array section and the peripheral circuit section as in the conventional example, accordingly the surface area is reduced, and the pixel array section 17, which is positioned substantially at a center portion of the quartz glass substrate 1, can advantageously be assembled into the casing or housing.

FIG. 1 shows one example of the monocrystalline semiconductor type light valve cell, however, the present invention is not limited to such examples. Generally, the monocrystalline semiconductor type light valve cell is a light valve device of a compact type with high accuracy wherein the driving circuit, the other peripheral circuit section and the pixel array having the monocrystalline semiconductor layer as an active region are formed on one chip. The pixel array is of an active matrix type and a simple-matrix type. Switching elements in case of the active matrix type uses amorphous silicon transistors, polysilicon transistors, diodes and the like in addition to monocrystalline silicon transistors, which are provided corresponding to the pixel electrodes respectively. In the simple matrix type, the pixel array is formed of only the pixel electrodes arranged in a intersecting manner with matrix shape in the vertical direction and horizontal direction, and without switching elements. In either of the cases, the monocrystalline semiconductor type light valve elements feature formation of the peripheral circuit section into the monocrystalline semiconductor layer.

Figure 2:
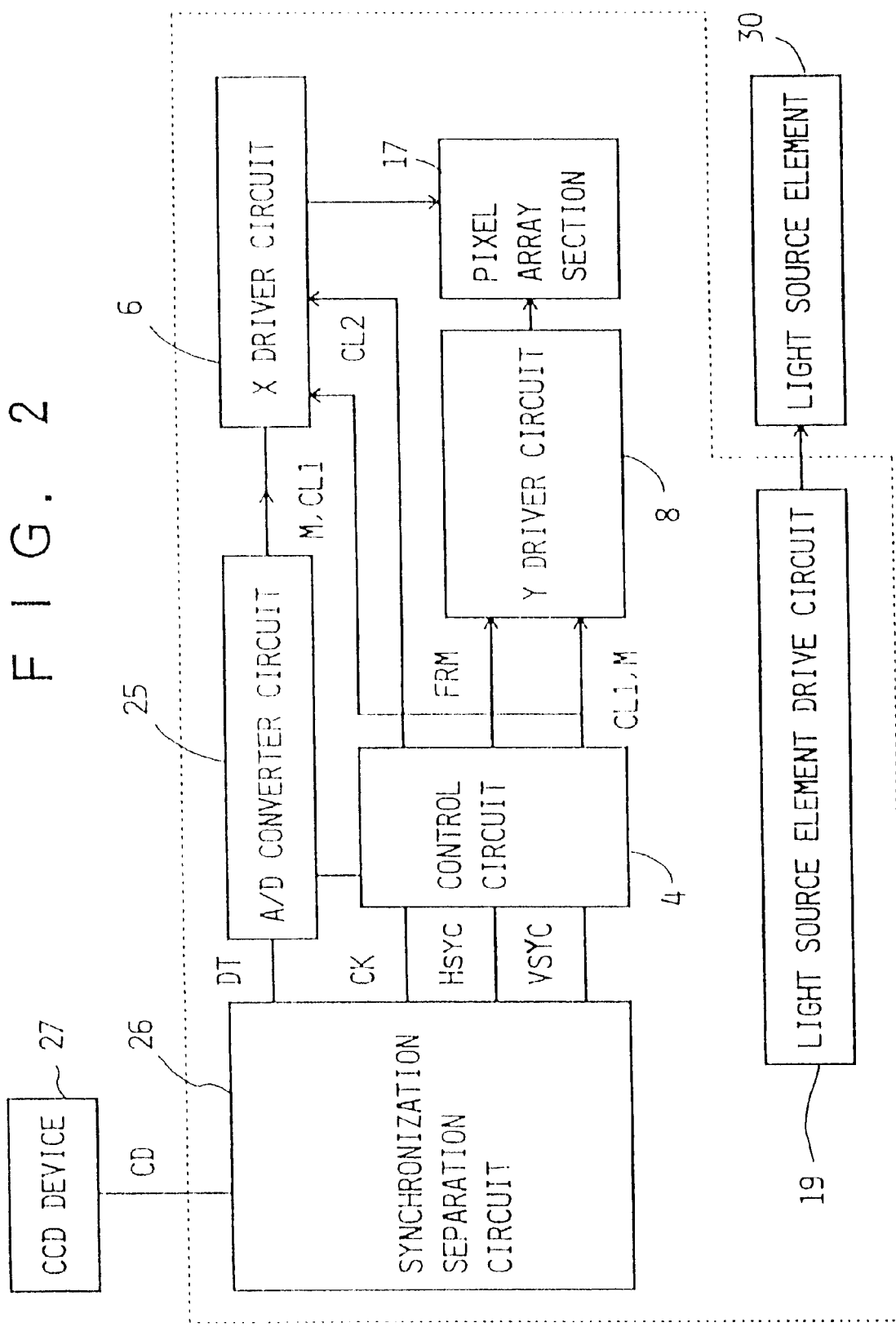
FIG. 2 is a circuit diagram showing one embodiment of the invention.

FIG. 2 shows one embodiment where a compact type image display device according to the invention is applied to a view finder of a 8 mm video camera. FIG. 2 shows a configuration of a CCD image pickup device 27 as a element for picking up the object image, image pickup signals of the CCD image pickup device 27 are composite signals of the video signals and the synchronization signals, and these signals are input into the synchronous separation circuit 26 of the data signal generating circuit. The configuration comprises an A/D conversion circuit 25 for A/D converting the video signals of the synchronous separation circuit 26, the control circuit 4 for generating the timing signals for display, the X driving circuit 6, the Y driving circuit 8, the light source element driving circuit 19 for driving the pixel array section 17 and a light source element 30.

An operation in FIG. 2 is described. Composite signals CD from the CCD image pickup device are input into the synchronous separation circuit 26 of the data signal generating circuit. The synchronous separation circuit 26 outputs video signals DT to the A/D conversion circuit 25. The synchronous separation circuit 26 outputs horizontal synchronization signals HSYC, vertical synchronization signals VSYC, and clock signals CK to the control circuit 4. The clock signals CR are a reference clock signal generated when a PLL circuit (not shown) is inputted with the horizontal synchronization signals.

The A/D converter circuit 25 converts the video signal DT into the 4 bit digital signals to be outputted to the X driving circuit 6. The control circuit 4 generates the timing signals (data shift clock signals CL2, data latch signals CL1, frame signals FRM, and alternating-current-forming control signals M and like signals) required for operating the X driving circuit 6 and the Y driving circuit 8. The X driving circuit 6 and the Y driving circuit 8 are operated by the timing signals of the control circuit 4 to display images on the pixel array section 17. An optical element 30 such as EL is disposed on backside of the transparent pixel array section, and driven by the driving circuit 19 for driving the light source element 30.

Figure 3:
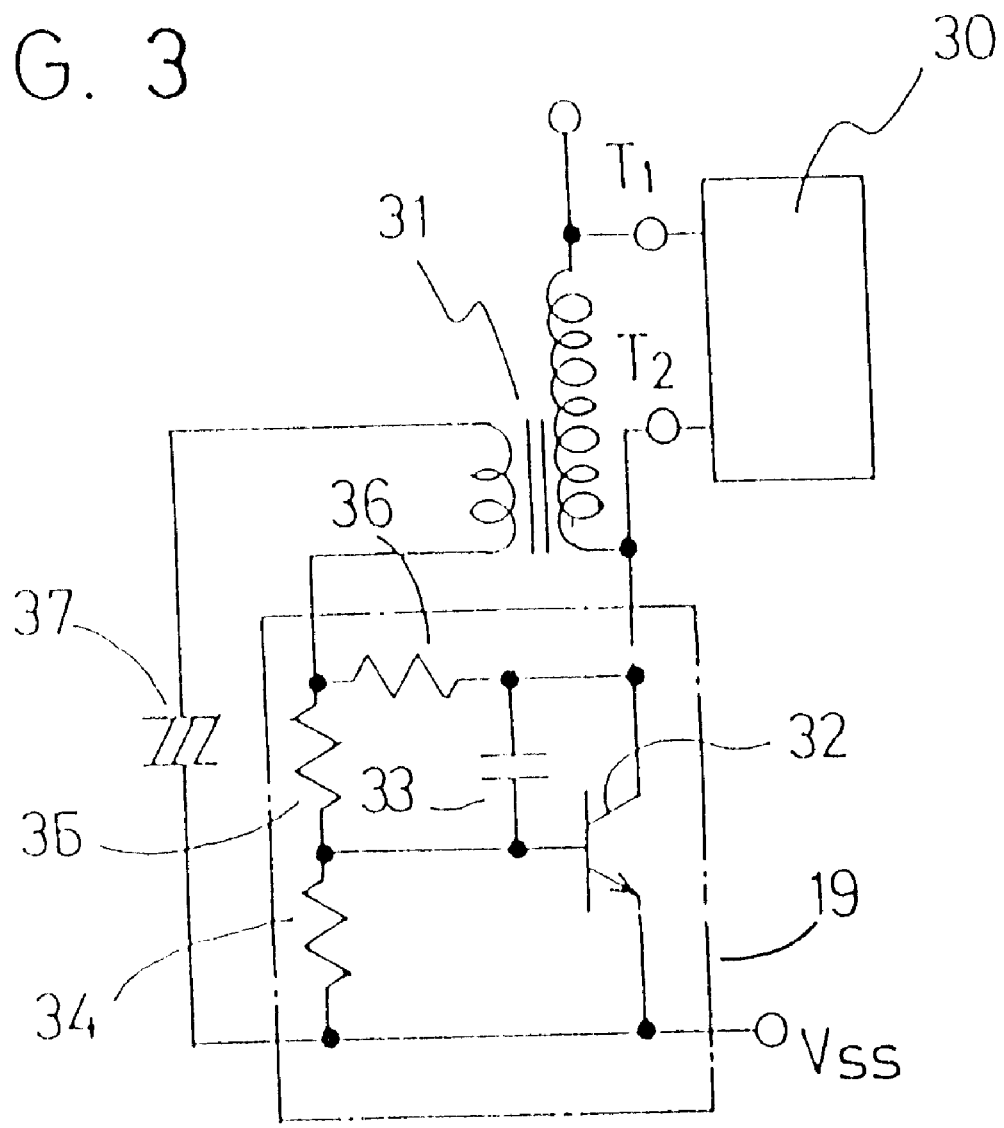
FIG. 3 is a circuit diagram showing an embodiment of a light source element driving circuit.

FIG. 3 shows one embodiment of the light source element driving circuit 19. In FIG. 3, the light source element driving circuit 19 connects a transformer 31 and a electrolytic capacitor 37 to the outside of the light source element driving circuit 19. The EL light source element 30 is connected between terminals T1 and T2 to produce oscillation by inductance L of the transformer 31 and capacitance C of the EL light source element 30. The current variation arisen therefrom induces reverse phase voltage in a secondary coil. The induced voltage is fed back to a base of a transistor 32. Thus, the induced voltage is amplified and by the transistor 32 and its phase is inverted to operate for driving a load due to inductance L of the transformer and capacitance C of the EL light source element. Hence, output voltage with driving waveform of 400 Hz at about 100 V is output across the terminals T1 and T2, and lights on the EL light source element 30.

Figure 4:
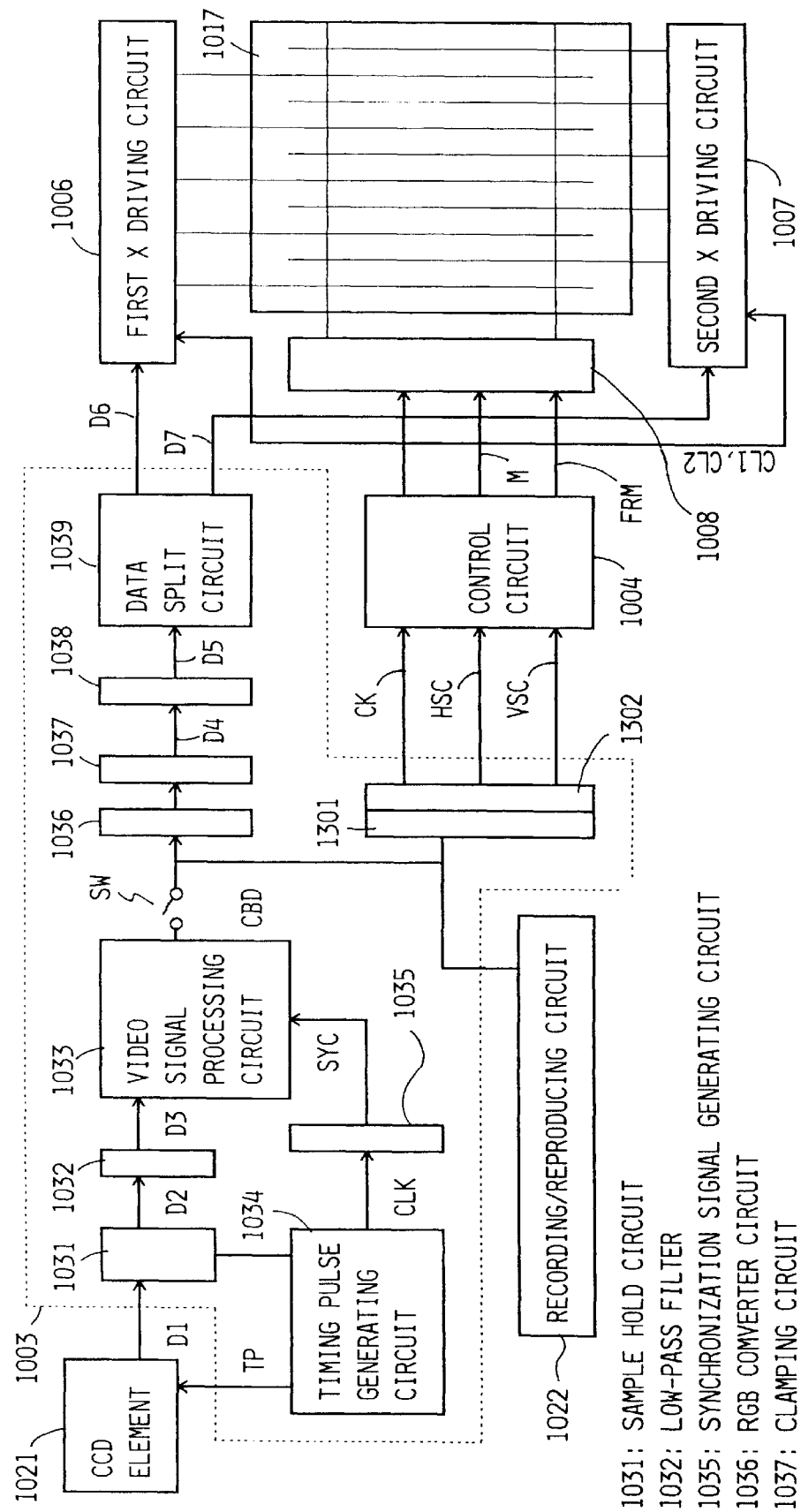
FIG. 4 is a block diagram showing a television camera view finder assembled using a monocrystalline semiconductor type image display device according to the present invention.

FIG. 4 is a block diagram showing a concrete example wherein the monocrystalline semiconductor type image display device according to the present invention is applied to view finders of the 8 mm video cameras. The monocrystalline semiconductor type image display device is externally connected with a CCD element 1021 and a recording/reproducing circuit 1022. The CCD element 1021 picks up the object image to output image signals D1. The recording/reproducing circuit 1022 is provided for recording and reproducing the image pickup signals D1.

The monocrystalline semiconductor type image display device comprises a display data generating circuit 1003, a control circuit 1004, a pair of X driving circuits 1006 and 1007, a Y driving circuit 1008, and a pixel array section 1017. The display generating circuit 1003 generates display data required for displaying pickup image information supplied from the CCD element 1021. The control circuit 1004 generates various timing signals in accordance with a synchronization signal obtained from the display data generating circuit 1003. The X driving circuits 1006, 1007 and the Y driving circuit 1008 feed a predetermined driving voltage to a matrix driving electrode group of the pixel array section 1017 depending on the timing signals. Color filters of red (R), blue (B), green (G) are formed into film on the common electrode of the pixel array section 1017, for example, by electrodepositon or the like in order to match individual pixel electrodes, thereby the color display is achieved. The display data generating circuit 1003, the control circuit 1004, a pair of the X driving circuits 1006 and 1007, and the Y driving circuit 1008, and the pixel array section 1017 are formed unitary on the same substrate to produce a circuit. The display data generating circuit 1003 comprises a sample hold circuit 1031, a low-pass filter 1032, A video signal processing circuit 1033, a timing pulse generating circuit 1034, a synchronization signal generating circuit 1035, a RGB converter circuit 1036, a clamping circuit 1037, an A/D converter circuit 1038, a data separation circuit 1039. a synchronization separation circuit 1301, and a PLL circuit 1302.

An operation of a view finder is described referring to FIG. 4. A timing pulse TP produced by the timing pulse generating circuit 1034 is input into the CCD element 1021 to cause the CCD element 1021 to output the pickup signals D1 as serial analog data. The sample-and-hold circuit 1031 positioned at an input stage of the display data generating circuit 1003 sample and holds the pickup signals D1 depending on the sample-and-hold signals SP fed from the timing pulse generating circuit 1034. The sample-and-hold circuit 1031 takes out only a video signal D2 from waveforms of the pickup signals D1 to input it into the low-pass filter 1032 of the next stage. The low-pass filter 1032 eliminates clock noise due to the sample-and-hold signals SP from the video signals D3 to input the video signals into the video signal processing circuit 1033 of the next stage. The video signal processing circuit 1033 processes the video signals D3 in various ways to output composite video signals CBD. The processes include, for example, clamping, T correction, white clipping, blanking mix, pedestal, and sink mix and the like. The synchronization signal generating circuit 1035 divides frequency of, the clock signal CLK fed from the timing pulse generating circuit 1034 to produce synchronization signals SYC, which is input into the video signal processing circuit 1033. The video signal processing circuit 1033 composes the synchronization signal SYC with the video signals D3 to produce a desired composite video signals CBD.

To record or display the object image picked up by the CCD element 1021, a switch SW is turned ON. The composite video signals CDB are transferred to the recording/reproducing circuit 1022 and recorded in a magnetic tape. To display the object image on the view finder, the composite video signals CBD are input into the RGB converter circuit 1036 to be separated into a brightness signal and a color signal, thereafter the signals are converted into RGB display signals and fed to the clamping circuit 1037 of the next stage, The clamping circuit 1037 is provided for clamping a direct current level of the composite video signals CBD. RGB display signals D4 thus clamped are converted into corresponding digital display data D5 by the A/D converter circuit 1038. The digital display data D5 are split into two by the data split circuit 1039, the respective display data D6, D7 are transferred to the first and the second X driving circuit 1006, 1007.

The composite video signals CBD are also input into the synchronization separation circuit 1301, which separates the horizontal synchronization signals HSC and the vertical synchronization signals VSC from the composite video signals CBD. The horizontal synchronization signals HSC thus separated are input into the PLL circuit 1302, which outputs the reference clock signal CK. The reference clock signal CK, the horizontal synchronization signals HSC, and the vertical synchronization signals VSC are input into the control circuit 1004. In accordance with these synchronization signals, the control circuit 1004 generates various timing signals required for operating the X driving circuits 1006, 1007 and the Y driving circuit 1008. These timing signals include data shift clock signals CL2, data latch signals CL1, frame signals FRM, and alternating-current forming signals M and the like.

A pair of the X driving circuits 1006, 1007 and the Y driving circuit 1008 are operated in accordance with these timing signals to reproduce and display color images on the pixel array section 1017. A pair of the X driving circuits 1006 and 1007, which are split and arranged over and under the pixel array section 1017, synchronously take two series of the display data D6 and D7 separated by the data split circuit 1039. A matrix driving electrode group connected to a pair of the upper and lower X driving circuit 1006 and 1007, that is, a signal lines are intersected orthogonally with a matrix driving electrode group connected to the Y driving circuit 1008, i.e., with gate lines, which forms a matrix structure. Among a plurality of the signal lines, odd-numbered lines are connected to the first X driving circuit 1006, and even-numbered lines are connected to the second X driving circuit 1007. The switching elements positioned at each intersecting point in the matrix are electrically conducted, thereby the desired signal voltage is applied to the corresponding pixel electrodes to use an electrooptic effect of liquid crystal and to display the image. To reproduce once recorded image data on the view finder, the switch SW is made in a turn OFF state, then the composite video signals CBD are supplied to the RGB converter circuit 1036 from the recording/reproducing circuit 1022. Therefore, a color image can be reproduced and displayed on the pixel array section 1017 by the same operation as that in recording.

Figure 5:
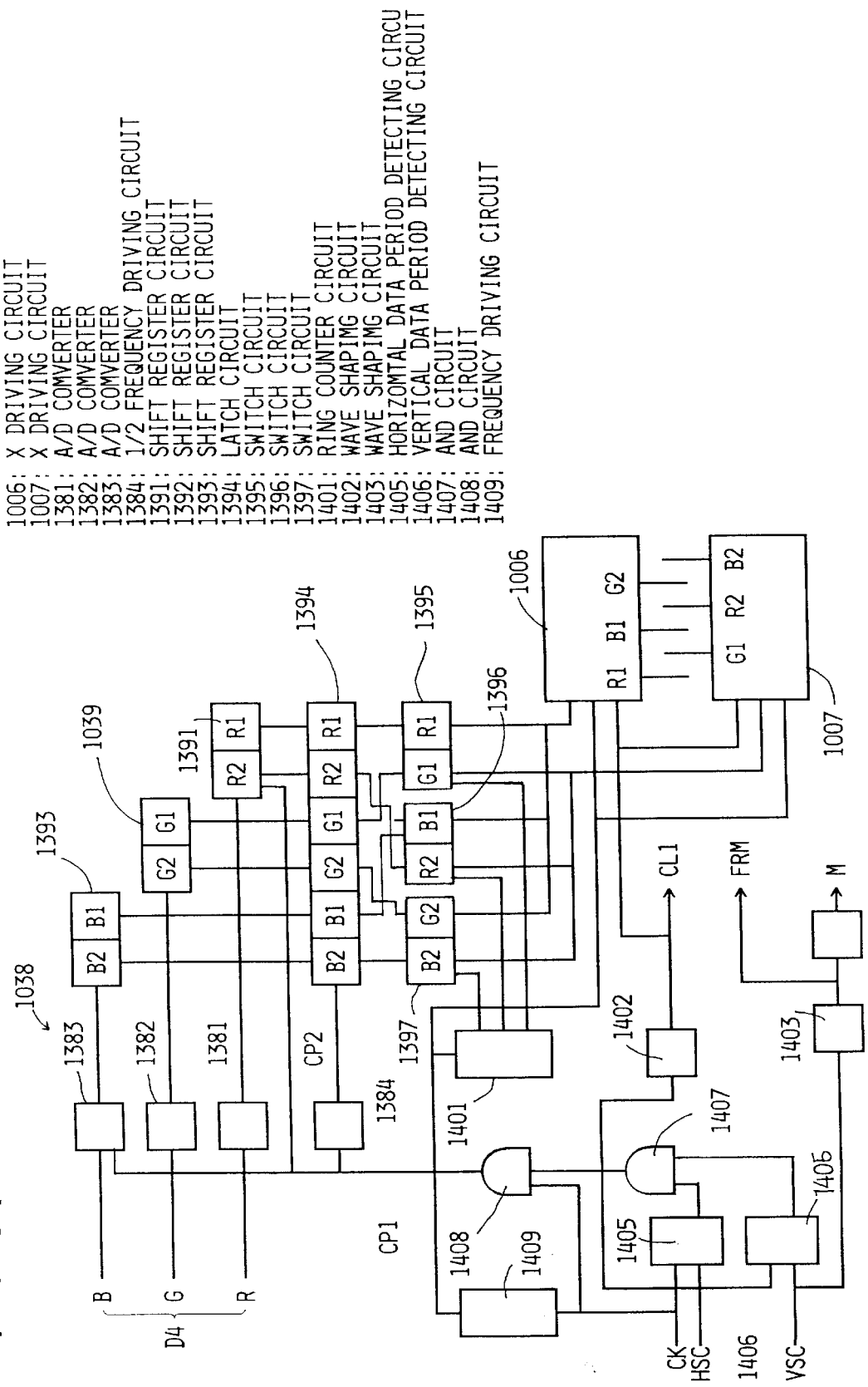
FIG. 5 is a block diagram showing a concrete structural example of a display data generating circuit and a control circuit as shown in FIG. 4.

FIG. 5 is a block diagram showing a concrete configuration of the A/D converter circuit 1038, data split circuit 1039, and control circuit 1004 among the display data generating circuit 1003 shown in FIG. 4. In the drawing, the A/D converter circuit 1038 is composed of three A/D converters 1381, 1382, 1383 corresponding to RGB three primary colors respectively, where respective color components of the analog display signals D4 are converted into digital parallel display data of 4 bits each. Symbols R, G, B are hereinafter used for discriminating the display data at every color basis. The data split circuit 1039 includes shift register circuits 1391, 1392, 1393 for shifting 4 bit parallel data R, G, b, a latch circuit 1394 for temporily latching output of the sift register circuit, switch circuits 1395, 1396, 1397 for sequentially switching output of the latch circuit 1394, and a ring counter circuit 1401 for generating timing signals SP1, SP2, SP3 in order to make these switch circuits sequentially in a turn-ON state. The control circuit 1004 includes a horizontal data period detecting circuit 1405 for detecting an effective data period corresponding to one line, a vertical data period detecting circuit 1406 for detecting an effective data period of one frame, AND circuits 1407 and 1408, waveform shaping circuits 1402 and 1403, and a ½ frequency dividing circuit 1404.

An operation is explained referring to the FIG. 5. Depending on the horizontal synchronization signals HSC and the reference clock signal CK, the horizontal data period detecting circuit 1405 outputs a control signal that comes to a low level during a horizontal blanking period and to a high level during a display data output period. The vertical data period detecting circuit 1406, which is input with the horizontal synchronization signals HSC and the vertical synchronization signals VSC, outputs a control signal that comes to a low level during a vertical blanking period and to a high level during a valid display data output period of one frame. The control signals obtained from the horizontal data period detecting circuit 1405 and the vertical data period detecting circuit 1406 is input into the AND circuit 1407. The output of AND circuit 1407 and the reference clock signal CK are input into the A/D circuit 1408 of the next stage. Depending on the output signal CP1 of the AND circuit 1408, the RGB components of display signals D4, which are input into the A/D conversion circuits 1381, 1382, 1383, are converted into 4 bit digital data respectively. The digital data thus converted are shifted to 4 bit parallel shift register circuits 1391, 1392, 1393 respectively. The output data of these shift register circuits 1391, 1392, 1393 are input into the latch circuit 1394.

The output signal CP1 of the AND circuit 1408 is ½ frequency-divided by a 112 frequency dividing circuit 1384. This frequency divided signal CP2 is input into the latch circuit 1394 as a latch signal. The output data of the latch circuit 1394 are input into the switch circuit 1395, 1396, 1397. The latch circuit 1394 contains display data of R1, R2, G1, G2, B1, and B2 in sequence from right to left. These display data are transferred to three switch circuits 1395, 1396, 1397 to perform change in a predetermined data alignment order. R1 is stored in right-side of the first switch circuit 1395 and G1 is stored in left-side of the same. B1 is stored in right-side of the second switch circuit 1396 and R2 is stored in left-side of the same. G2 is stored in right-side of the third switch circuit 1397 and B2 is stored in left-side of the same. Suffix numbers 1 and 2 attached on the RGB data represent the order in which the date are transferred to the shift registers respectively. The switch circuits 1395, 1396, 1397 are sequentially switched ON by gate signals SP1, SP2, SP3 fed from the ring counter circuit 1401 to output a pair of display data D6 and D7 split into two.

The clock signal CP3 fed to the ring counter circuit 1401 is a signal which is obtained by dividing frequency of the reference clock signal CK by the frequency dividing circuit 1409. The display data D6 and D7 thus divided are input into the first and second X driving circuit 1006 and 1007 to be sequentially shifted by pulses using the dividing clock signal CP3 as a shift clock signal CL2, thus the display data corresponding to one line are transferred. The split display data D6 transferred to the first X driving circuit 1006 include R1, B1, G2, and the other split display data D7 transferred to the second X driving circuit 1007 include G1, R2, B2. As is apparent from the drawing, these display data are those alternatively split into an upper and a lower section. The display data thus transferred are latched by latch signals CL1. The display data thus latched are converted into the analog display signals by an incorporated D/A converter circuit to output to a matrix driving electrode group. The latch signals CL1 are produced by the waveform shaping circuit 1402 into which the horizontal synchronization signals HSC is input. The other waveform shaping circuit 1403 with an input of the vertical synchronization signals VSC generates a frame signals FRM, which are fed to the Y driving circuit to become a starting data of scanning signals. The frame signals FRM are ½-frequency-divided by the ½ frequency dividing circuit 1404 to become an alternating-current inversion signals M and to control polarity inversion of the driving voltage applied on liquid crystal, thus alternating-current driving is performed.

As is apparent from the explanation above, the data of the analog display signals D4 are transferred in a manner the condition that the analog display signals D4 is temporarily being converted into the digital display data by the A/D conversion circuit 1038. Accordingly, it is possible to effectively prevent attenuation of signal component arisen during data transfer. The display data are divided into two and fed to a pair of the X driving circuits 1006 and 1007. Thus, a transfer clock frequency can be made half compared to the conventional example.

Figure 6:
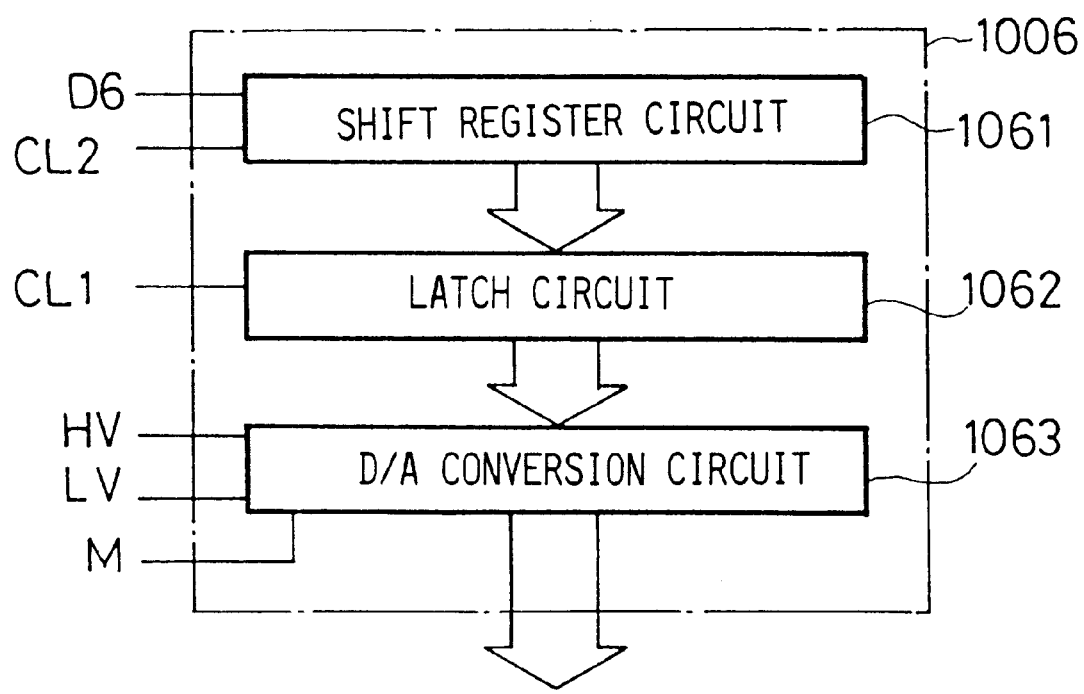
FIG. 6 is a block diagram showing an example of a first X driving circuit in FIG. 4.

FIG. 6 is a block diagram showing a concrete configuration of the first X driving circuit 1006. The second X driving circuit 1007 also has a similar configuration as the above. In the drawing, the X driving circuit 1006 comprises a 4 bit parallel shift register circuit 1061, a latch circuit 1062, and a D/A conversion circuit 1063. The 4 bit parallel data D6 thus input are sequentially shifted by the shift clock signals CL2. The frequency of the shift clock signals CL2 can be a half compared to the conventional example. Data corresponding to one line are transferred, then latched by the latch signals CL1. The data thus latched are level-converted, thereafter converted into the analog display signals by the D/A conversion circuit 1063 to output a driving voltage. The D/A conversion circuit 1063 uses a high voltage HV and a low voltage LV as a driving voltage source, and controls the analog driving voltage polarity so as to invert depending on the polarity inversion signals M. The polarity inversion signals M, after being level-converted, are applied to the common electrode arranged on the opposite substrate to alternatively drive liquid crystal. As mentioned above in the embodiment, the digital data are converted into the analog signals at a final stage, thereafter applied to the liquid crystal layer. Therefore, no attenuation arises at a signal transfer stage in the middle of the whole process.

Figure 7:
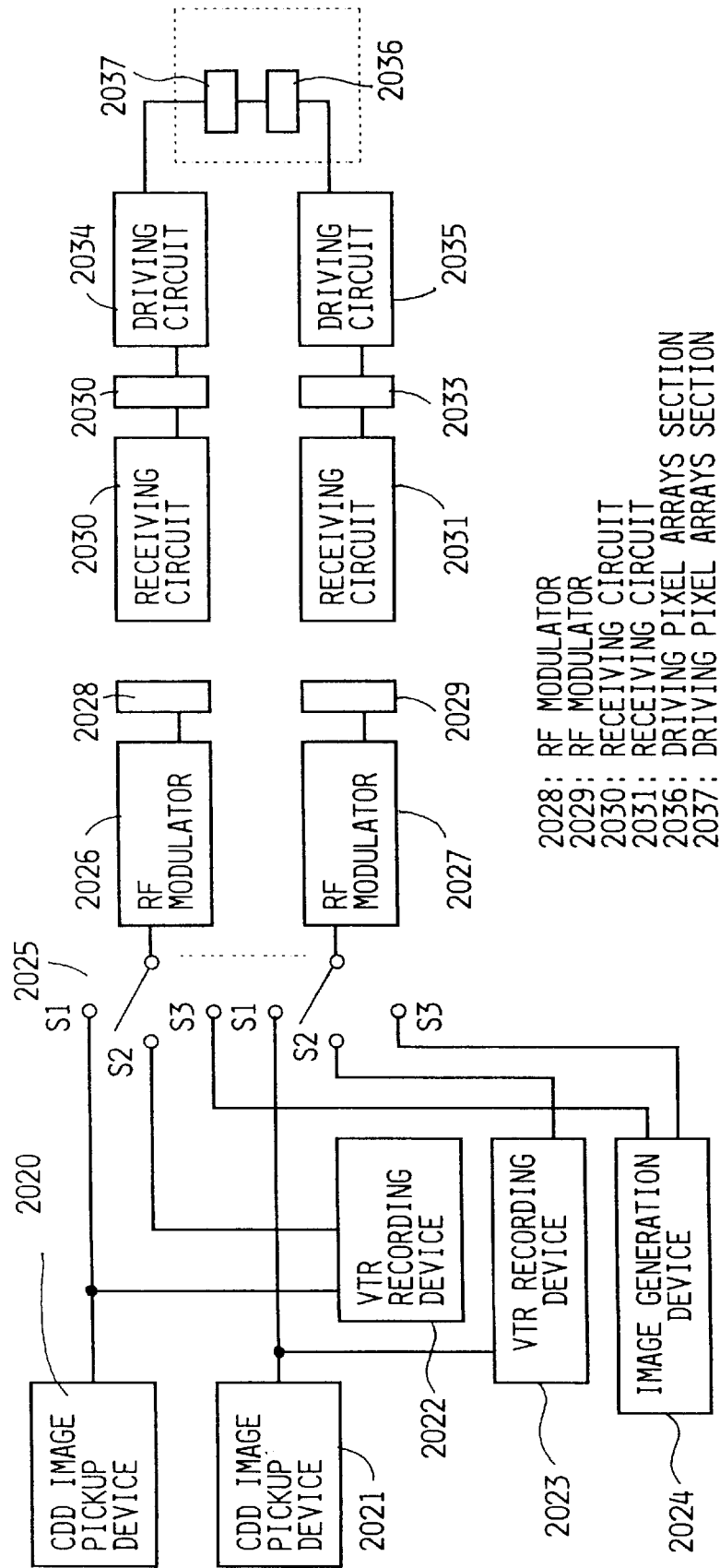
FIG. 7 is a circuit diagram showing one embodiment of the present invention.

FIG. 7 is a circuit diagram of one embodiment according to the invention. In FIG. 7, 2020 and 2021 represent CCD image pickup devices for photographing images for a right eye and a left eye respectively. 2022 and 2023 are VTR recording devices for recording image data of the image pickup devices. 2024 is an image generating device such as a video disk for generating image data for the right eye and the left eye. 2025 is a switch for switching data for selecting one of the devices. 2026 and 2027 are RF modulators for converting the image data into signals capable of being transmitted by radiowave. 2028 and 2029 are amplifier circuits for amplifying the RF modulator signals, 2030 and 2031 are receiving circuits for receiving image signals transmitted, 2032 and 2033 are display data generating circuits for converting the received signals to generating display data. 2034 and 2035 are driving circuits for driving pixel arrays sections 2036 and 2037.

An explanation is given for a case that stereoscopic vision using the display elements 2036 and 2037 is obtained for image signals picked up by the CCD pickup device. The switch is connected to Si terminal, then the image signals for the right eye and the left eye picked up by the CCD image pickup devices 2020 and 2021 are input into the RF modulators 2026 and 2027. The image signals mixed with carrier wave by the RF modulators 2026 and 2027 are amplified by the amplifier circuits 2028 and 2029 to transmit the image signals from an antenna. The image signals are received by the antenna of the receiving circuits 2030 and 2031. The image signals thus received are divided into color data to generate display data by the display data generating circuits 2032 and 2033. The display data generated by the display data generating circuits 2032 and 2033 are input into the driving circuits 2034 and 2035 to drive the image array sections 2036 and 2037, thus the image photographed by the CCD image pickup devices 2020 and 2021 are displayed on a pixel array section for the right eye and on a pixel array section for the left eye respectively. As a consequence, a stereoscopic vision can be achieved.

Figure 8:
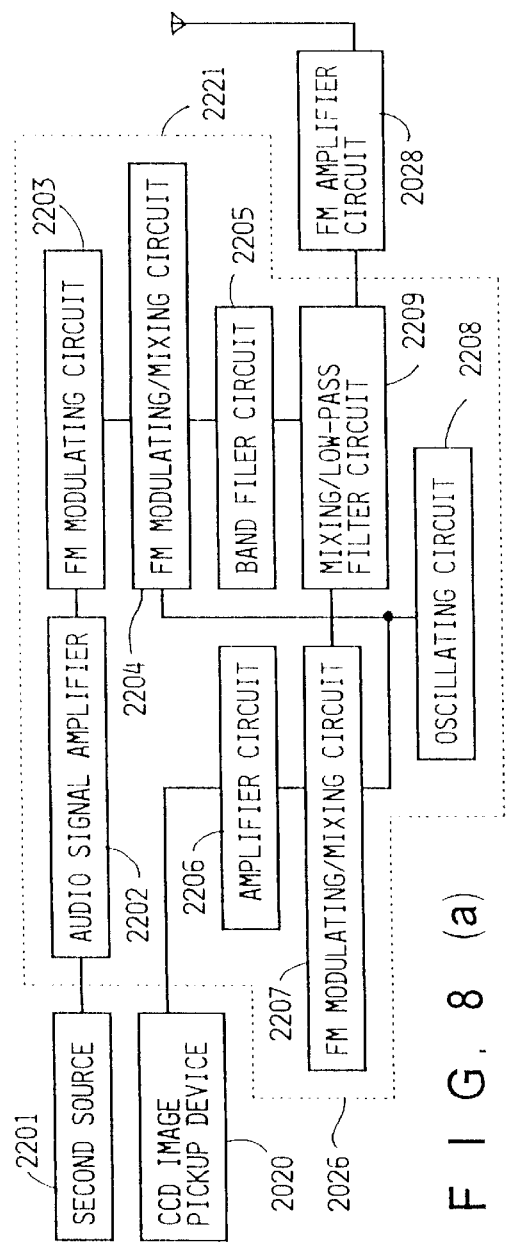
FIG. 8 shows a transmission circuit and a receiving circuit.
Figure 8:
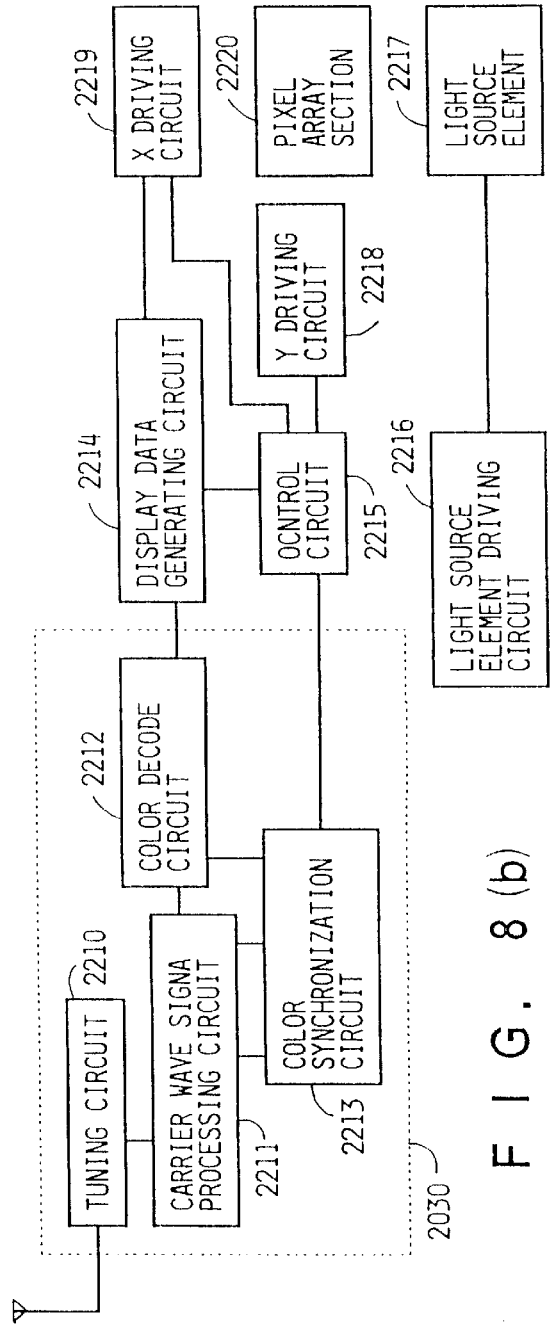

FIGS. 8(*a*) and 8(*b*) are circuit diagrams showing a transmitting-side and receiving-side of a display system for the right eye in the stereoscopic vision display device.

In FIG. 8(*a*), the RF modulator 2026 comprises; a amplifier circuit 2206 for amplifying image signals of the CCD image pickup device 2020, an AM modulating/mixing circuit 2207 for AM modulating the image signals and mixing it with carrier wave signals, a carrier wave oscillating circuit 2208 for generating carrier wave signals, an audio signal amplifier circuit 2202 for amplifying audio signals of a sound source 2201, a FM modulating circuit 2203 for FM modulating the audio signals, a FM modulating/mixing circuit 2204 for mixing FM modulating signals of the FM modulating circuit 2203 with the carrier wave signals, a band filter circuit 2205 for band passing an output of the circuit 2204, and a mixing low-pass filter circuit 2209 in which an output of the band filter circuit 2205 and an output of the AM modulating/mixing circuit 2207 are mixed each other and filtered so that only low frequency signals are passed. The output signals of the mixing/low-pass filter circuit 2209 are converted into image signals to be amplified by the RF amplifier circuit 2028 and transmitted through an antenna 2221.

In FIG. 8(*b*), a tuning circuit 2210 of the receiving circuit 2030 receives image signals using a receiving antenna 2222. The image signals received by the tuning circuit 2210 are input into a carrier wave signal processing circuit 2211. The image signals are amplified, band-amplified, and input into a color decoder circuit 2212, thus color demodulation and color matrix are performed to output color video signals. A color synchronization circuit 2213, which controls an oscillation frequency with voltage by using an output obtained by giving phase detection to burst signals and crystal controlled oscillation signals, inputs such frequency into the carrier wave signal processing circuit 2211 and the color decoder circuit, thereby a color synchronization is performed. Color outputs of red, blue, green from the color decoder circuit 2212 are input into R-Y, B-Y, G-Y display data generating circuit 2214, then the video signals are converted from analog to digital to be output. For the output of the display data generating circuit 2214, digital value inputted into a X driving circuit 2219 is converted into analog value at each output stage to output a driving voltage by an analog amount and to drive the pixel array section 2220.

A control circuit 2215 for generating display timing signals generates signals; namely, timing signals such as display data shift clock signals, frame signals, and data latch signals required for driving a Y driving circuit 2218 and the X driving circuit 2219; and alternating-current inversion signals for supplying alternating-current driving inversion signals to the display data generating circuit. The Y driving circuit 2218 linearly sequentially scans and drives the Y axis driving electrode of the pixel array section 2220 to execute the image display. A light source element 2217 arranged on backside of the pixel array section is a fluorescent tube and is driven by a light source element driving circuit 2216.

A method of producing the monocrystalline semiconductor type image display device according to the present invention is described in detail referring to FIG. 9(A) to FIG. 9(H). In process of FIG. 9(A), a quartz glass substrate 1101 and a silicon monocrystalline semiconductor substrate 1102 are prepared. As the silicon monocrystalline semiconductor substrate 1102 is preferably used a high quality of silicon wafer used for LSI production, crystal orientation thereof has a uniformity in a range of <100 >0.0+1.0 with a crystal lattice defect density equal to or less than 500 pieces/cm². First, a surface of the quartz glass substrate 1101 and a surface of the silicon monocrystalline semiconductor substrate 1102 are precisely smoothed. Following this, the both surfaces thus smoothed are piled and heated to be thermocompression-bonded each other. Both the substrates 1101 and 1102 are securely fixed by such thermo-compression-bonding process.

In process of FIG. 9(B), a surface of the silicon monocrystalline semiconductor substrate is ground. As a result, a silicon monocrystalline semiconductor layer 1103 result, a silicon monocrystalline semiconductor layer 1103 of thin film obtained by grinding up to a desirous thickness is formed on surface of the quartz glass substrate 1101. A two layered structured composite substrate is obtained, which are composed of the quartz glass substrate 1101 to be electric insulating layers and the silicon monocrystalline semiconductor layer 1103. The etching process in stead of grinding may preferable be employed for obtaining the silicon monocrystalline layer 1103. In the silicon monocrystalline semiconductor layer 1103 of thin film thus obtained, quality of the silicon wafer is kept as it is, so that there can be obtained a composite substrate member of an extremely high grade in crystal orientation uniformity and lattice defect density. To the contrary, the monocrystalline thin film obtained by re-crystallizing the polycrystal silicon thin film as in the conventional example is not suitable for LSI manufacturing because of its increased lattice defect and non-uniformity of crystal orientation.

In process of FIG. 9(C), the silicon monocrystalline semiconductor layer 1103 is given thermal oxidation treatment to its surface to deposit a silicon oxide film 1104 on the entire surface. On the silicon oxide film is deposited a silicon nitride film 1105 by chemical vapor phase epitaxy, further thereon is coated a resist 1106 patterned in a predetermined shape. The silicon nitride film 1105 and the silicon oxide film 1104 are etched through the resist 1106 to leave only an element region. In process D, after the resist 1106 is removed, the silicon monocrystalline semiconductor layer 1103 is thermally oxidized using, as a mask, the silicon oxide film 1104 and the silicon nitride film 1105 coating an element region, thus a field oxide film 1107 is formed. The silicon monocrystalline semiconductor layer 1103 remains in an region surrounded by the field oxide film 1107 to form the element region. The silicon oxide film 1104 and the silicon nitride film 1105 used as a mask are removed as in this drawing.

In process of FIG. 9(E), the thermal oxidation treatment is again executed to form a gate oxide film 1108 on the surface of the silicon monocrystalline semiconductor layer 1103. In process F, a polycrystalline silicon film is deposited by chemical vapor phase epitaxy. This polycrystalline silicon film is selectively etched through a resist 1110 patterned in a predetermined shape to form a polycrystalline silicon gate electrode 1109 on the gate oxide film 1108.

In process of FIG. 9(G), after the resist 1110 is removed, impurity arsenic is ion injected through the gate oxide film 1108 using the polycrystalline silicon gate electrode 1109 as a mask, a source region 1111 and a drain region 1112 are formed on the silicon monocrystalline semiconductor layer. Consequently, on the lower gate electrode 1109 is formed a channel region 1113 where the impurity arsenic is not injected between the source region 1111 and the drain region 1112.

Finally in process FIG. 9(H), a part of the gate oxide film 1108 positioned on the source region is removed to make a contact hole, to which a source electrode 1114 is connected. Similarly, a part of the gate oxide film 1108 on the drain region is removed to make a contact hole, which is covered by forming a pixel electrode 1115 thereon. The pixel electrode 1115 is composed of transparent conductive material made of ITO etc. In addition, the field oxide film 1107 disposed under the pixel electrode 1115 is also transparent, the quartz glass substrate 1101 arranged on further under the field oxide film is also a transparent one. Thus, a three layered structure composed of the pixel electrode 1115, the field oxide film 1107, and the quartz glass substrate 1101 is a optically transparent substrate. In the following process (not shown in the drawing), the common electrode is adhered with the opposite electrode on which the color filter is formed, a liquid crystal layer is filled and sealed in a gap between the two to complete the monocrystalline semiconductor type image display device.

In the embodiments explained, only the production of TFT constituting the pixel switching elements has been shown and described. However, at the same time, on the monocrystalline semiconductor layer is formed TFT which is contained in the peripheral circuit section composed of the driving circuit, the display data generating circuit, and the control circuit etc. The present invention features the peripheral circuit section formed in the monocrystalline semiconductor layer. Hence, the pixel switching elements can be formed, of course, in the monocrystalline semiconductor layer, but in stead thereof, it can be formed partially of the polycrystalline semiconductor thin film or the amorphous semiconductor thin film. In the embodiment described, the opposite substrate is overlapped on the substrate surface-side on which the pixel array section and the peripheral circuit section to constitute the display device. However, it is understood that the present invention is not limited to such configurations, notwithstanding, the opposite substrate can be adhered to the flat back-side surface after the pixel array section and the peripheral circuit section have been transferred to the other substrates.

Figure 10:
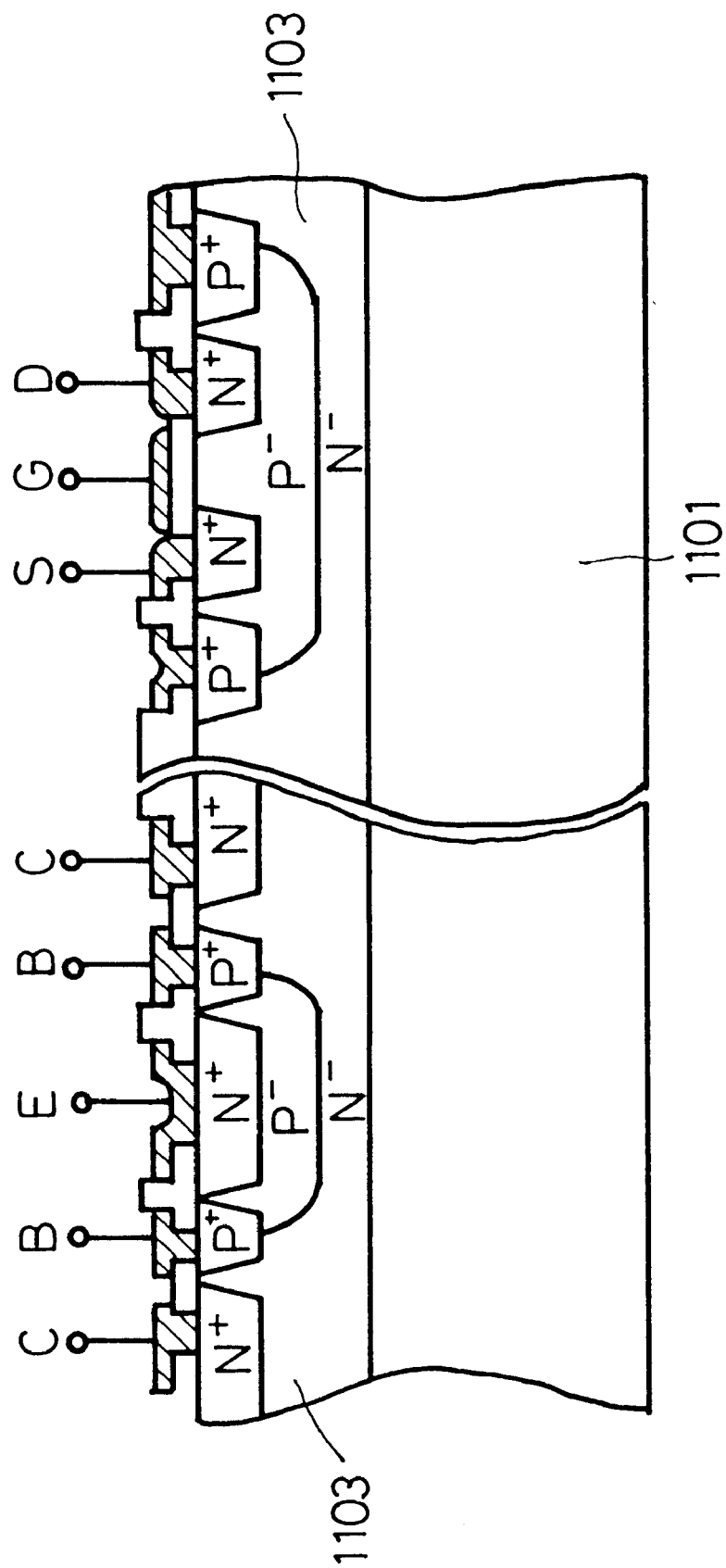
FIG. 10 is a schematic sectional view showing a modification example of the monocrystalline semiconductor type image display device according to the invention.

In the embodiment described above, the peripheral circuit section in addition to the switching elements contained in the pixel array section has been formed entirely of MOS transistors However, depending on circumstances, it is preferable that MOS transistors and bipolar transistors are formed one substrate to form a peripheral circuit section. Such a composite structure can be achieved when the monocrystalline semiconductor layers are used. FIG. 10 is a schematic sectional view where NPN bipolar transistors and N type MOS transistors are formed on one substrate. In the drawing, the silicon monocrystalline semiconductor layer 1103 is formed on surface of the quartz glass substrate 1101 with electric insulation to form the composite substrate described. A right half region thereof is formed of the N type MOS transistors, the left half region is formed of the NPN bipolar transistors. As is apparent from the drawing, the NPN transistors and the N type MOS transistors can simultaneously be formed. First, on a N– type silicon monocrystalline semiconductor layer 1103 is provided a P– type base diffusion layer. in which an N+ type emitter (E) region is formed. A P+ type base (B) region formed in the P– type base diffusion layer is diffused and formed at the same time with a P well of the N type MOS transistors in CMOS process. The N+ type emitter region can be formed at the same time with the N+ type source (S) region and the drain (D) region of the N type MOS transistors.

Figure 11:
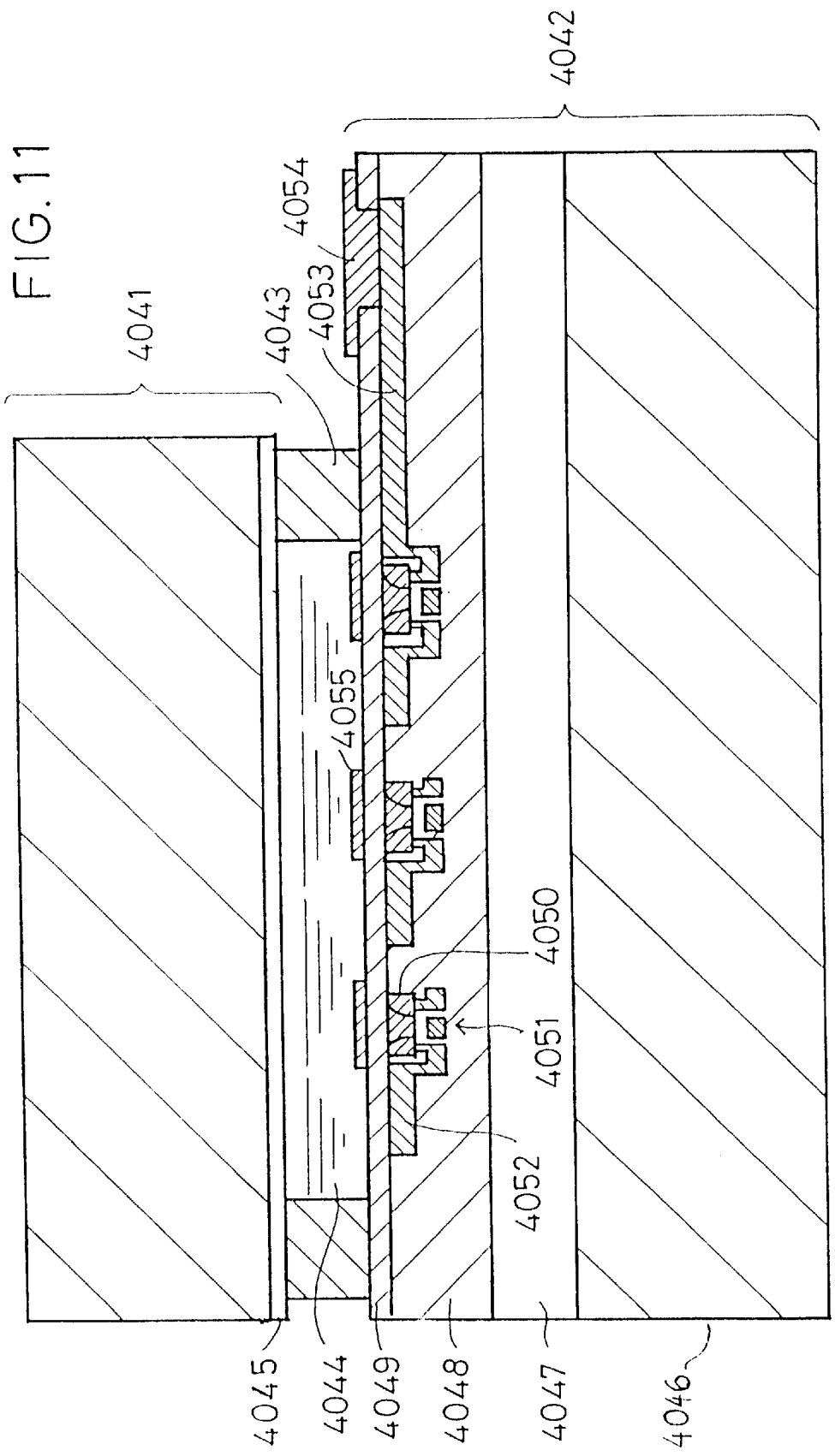
FIG. 11 is a sectional view showing an example of a light valve cell.

FIG. 11 is a schematic sectional view showing a structural example of the monocrystalline semiconductor type light valve cell. In the drawing, the light valve cell has a flat panel construction where an upper-side substrate 4041 and a lower-side substrate 4042 are adhered by resin seal members 4043, a liquid crystal layer 4044 is filled and sealed in a gap between the substrates 4041 and 4042. The opposite electrode 4045 is formed entirely on an inner surface of the upper-side substrate 4041.

The lower-side substrate 4042 is a layered structure, where from a lower-side are laminated an electric insulation base member layer 4046, a bonding layer 4047, a protecting layer 4048, and an insulation film layer 4049. A silicon monocrystalline semiconductor layer 4050 patterned in a predetermined shape is formed on backside surface of the transparent insulation film layer 4049, which is used as an active region to provide switching elements 4051 composed of the insulation gate field effect type transistors. Pixel electrodes 4052 formed of transparent conductive films are pattern formed on a portion where the silicon monocrystalline semiconductor layer 4050 is removed. In addition there are wiring patterns 4053 for electrically connecting the switching elements 4051 and the peripheral circuit (not shown) each other, which are introduced to a take-out electrode 4054 formed on the front-side surface of the insulation film layer 4049. On a front-side surface of the insulation film layer 4049 is formed a shielding films 4055 patterned corresponding to the switching elements 4051. As is apparent from the drawing, the present monocrystalline semiconductor type light valve cell is of a transfer type construction, where the pixel array section and the peripheral circuit section (not shown) are positioned at the back-side surface of the insulation film layer 4049. The present invention is not limited to such embodiments and it is of course that the invention can employ an ordinary construction in which the pixel array section and the like are formed on a front-side surface. In case of the transfer type, an exposed surface of the insulation film layer 4049 becomes flat, this is convenient not only for cell assembling but also for using the exposed surface as an electrode take-out region.

FIGS. 12(A) to 12(E) are process flow diagram showing one example of a method of producing a transfer type light valve cell as shown in FIG. 11. First in process FIG. 12(A), a composite substrate 4061 is prepared. The composite substrate 4061 has a structure that a silicon base member 4062 and a silicon monocrystalline semiconductor layer 4063 are adhered with each other by an insulation film layer 4064. The silicon monocrystalline semiconductor layer 4063 is adhered with a silicon bulk wafer generally used for LSI used for LSI device manufacturing process and thereafter ground and etched, to produce a thin film. Which has the same high quality as that of the silicon bulk wafer.

Figure 12A:
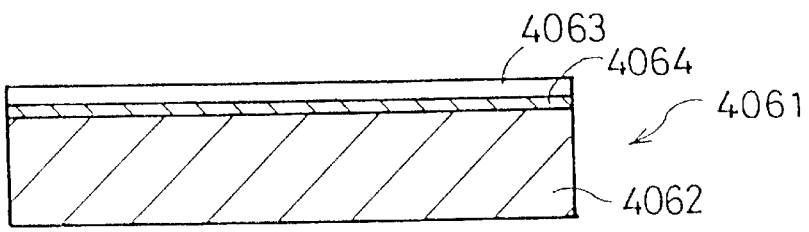
FIGS. 12(A) to 12(E) are process of producing the light valve cell.
Figure 12B:
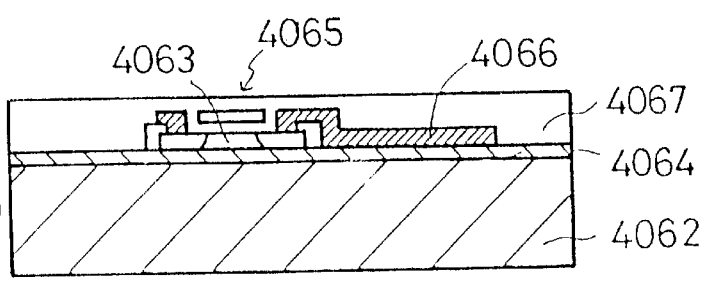
Figure 12C:
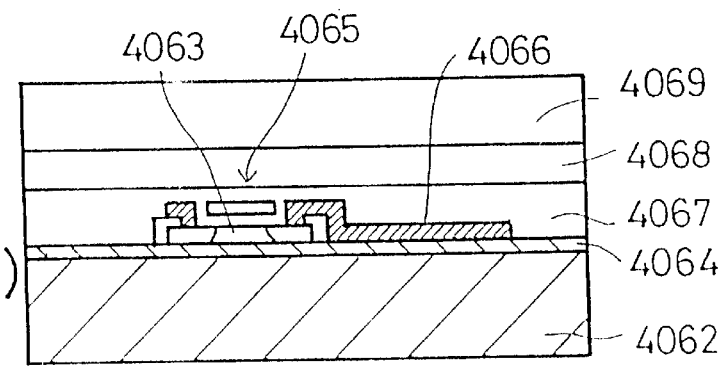
Figure 12D:
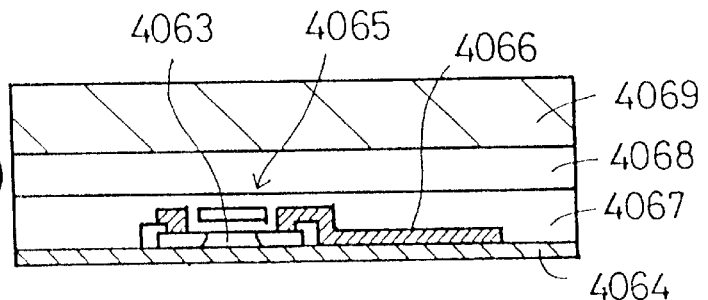
Figure 12E:
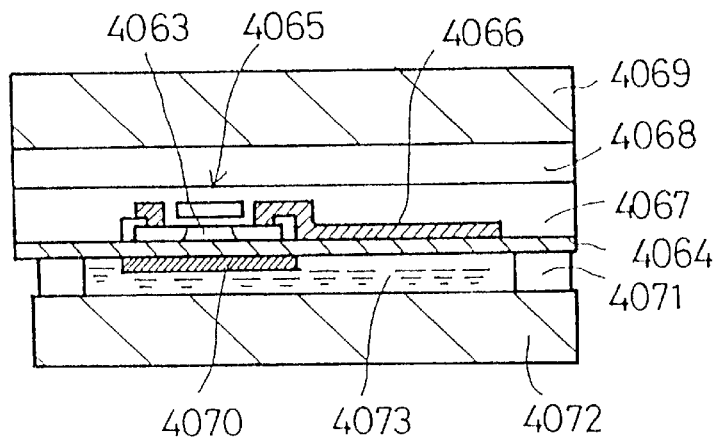

Next, an IC process is performed in FIG. 12(B), the switching elements and the peripheral circuit section are simultaneously and unitarily integrated and formed. In the drawing, only the switching elements are shown. The silicon monocrystalline semiconductor layer 4063 is patterned in a predetermined shape and used as an active region to form switching elements 4065. The pixel electrodes 4066 patterned in a predetermined shape is provided on an area where the silicon monocrystalline semiconductor layer 4063 is removed. For passivation, the above is coated with a protecting layer 4067 composed of silicon dioxide and the like. In process FIG. 12(C), a glass substrate 4069 is adhered to the protecting layer through a bonding layer 4068 formed of silicon dioxide paste etc. In process FIG. 12(D), the lower-side silicon base member 4062 is removed by etching, the lower-side of the insulation film layer 4064 is entirely exposed. In this way, the pixel array section and the peripheral circuit section are transferred to the glass substrate 4069 side from the initial silicon base member 4062. Finally, in process FIG. 12(E), a light shield film 4070 patterned in a predetermined shape is formed on the lower surface of the exposed insulation film layer 4064 to shield the switching elements 4063 from an external incident light. A opposite substrate 4072 is adhered to the insulation film layer through a resin seal member 4071, and a liquid crystal layer 4073 is filled and sealed in a gap between the two to complete a monocrystalline semiconductor type light valve cell.

Figure 13:
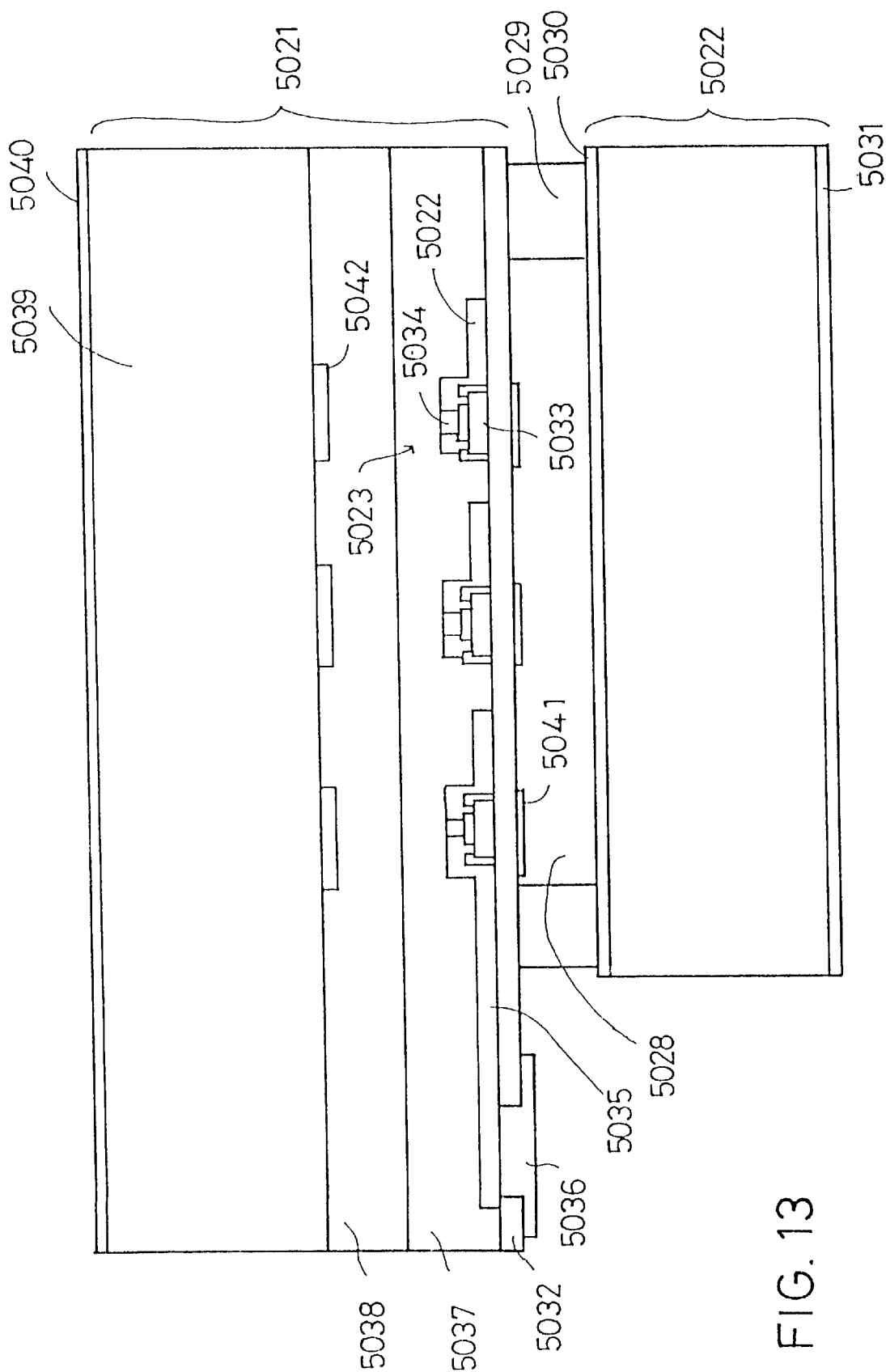
FIG. 13 is a schematic sectional view of a monocrystalline semiconductor type light valve device.

FIG. 13 is a sectional view showing a concrete structure example of the monocrystalline semiconductor type light valve. The light valve has a flat panel construction that one transparent substrate 5021 and the other transparent substrate 5022 are bonded each other with a predetermined gap between the substrates. A liquid crystal layer 5028 is filled and sealed in the gap. Such gap is sealed by a resin seal 5029. The lower transparent substrate 5022 is composed, for example, of glass plates and the like, on the inside surface thereof is formed entirely an opposite electrode 5030. An outer surface is adhered with a polarizer 5031.

The upper transparent substrate 5021 is of a layered structure, on the lowest layer thereof is positioned a transparent insulation film 5032, on which are integrally formed the pixel electrode 5022, switching elements 5023, peripheral circuits (not shown) such as a X driver and Y driver and the like. Different from the ordinary construction, the present light valve is of a transfer type, a method of producing it will be described in detail later. The present invention is not limited to the transfer type light valve. The invention can be an ordinary configuration where the pixel array section and the peripheral circuits are formed on the substrate surface. The switching element 5023 is composed of an insulated gate electric field effect type transistor in which a silicon monocrystalline semiconductor layer 5033 patterned in a predetermined shape is used as an active region. A drain electrode thereof is connected to the corresponding pixel electrode 5022, a gate electrode 5034 is arranged on a channel forming region of transistors through the gate insulation film. A wiring pattern 5035 composed of metal aluminum and the like are formed on the transparent insulation film 5032. This wiring pattern 5035 is electrically connected to the source electrode of the switching element 5023, and it is further connected to a pad take-out section 5036. The wiring pattern 5035 is also electrically connected to the peripheral circuit section, though not shown. On a surface of the transparent insulation film 5032 is formed a protecting film 5037, further thereon a glass base member 5039 is bonded through a bonding agent layer 5038, thereby preventing damage due to mechanical stress is still further thereon is adhered a polarizer 5040.

A shielding film 5041 is patterning formed through the transparent insulation film 5032 in a manner of matching with the switching element 5023. The shielding film 5041 shields incident light, to prevent the switching element 5023 from maloperation, and simultaneously to suppress a light leakage current. The shielding film 5041 is coated not only on the switching element but also on the peripheral circuit section. The shielding film 5041 is made of, for example, metal aluminum or silver or the like and has a reflectivity. Therefore, when it is incorporated in the projector, the light from the source is reflected, and not absorbed. For this reason, heating due to light absorption is suppressed, the temperature rise of the light valve is also suppressed effectively. In this example, an additional light reflective shielding film 5042 is patterning formed in an interface between the bonding member layer 5038 and the glass base member 5039 to substantially completely shield the switching element 5023 from the light at the upper and the lower side and to prevent the temperature rise effectively.

As hereinbefore described, since the switching element 5023 is formed into the silicon monocrystalline semiconductor layer 5033 having a extremely higher carrier mobility, this provides the light valve capable of high speed signal-response. The peripheral circuits such as X driver and Y driver and the like can be formed into one silicon monocrystalline semiconductor layer together with the switching elements 5023, thus the light valve with a high performance can be obtained. In this embodiment, a pair of polarizers 5031, 5040 are used, however, if as an electroptic material, polymer diffusion type liquid crystal, in which the liquid crystal is diffused into high polymer material, is used in stead of nematic liquid crystal having an ordinary twist alignment, then it is unnecessary to use the polarizer.

A method of producing the monocrystalline semiconductor type light valve according to the present invention is described in detail referring to FIGS. 14(A) to 14(E). In process FIG. 14(A), a composite substrate having a predetermined layered structure is prepared. This has a structure that a silicon monocrystalline semiconductor layer 5053 of thin film is adhered on a silicon substrate 5051 through a transparent insulation film 5052 made of silicon dioxide. The silicon substrate 5051 is provided in order to maintain a mechanical strength when the monocrystalline semiconductor layer 5053 is given of grinding or etching processes.

Figure 14A:
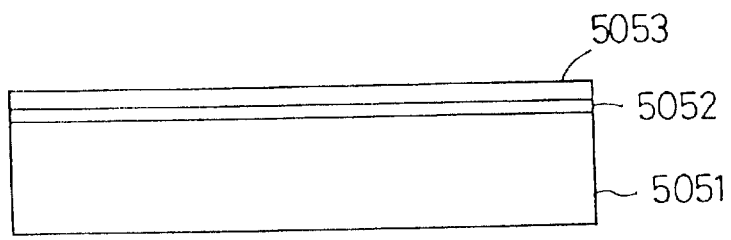
FIGS. 14(A) to 14(B) are process of producing the monocrystalline semiconductor type light valve device.
Figure 14B:
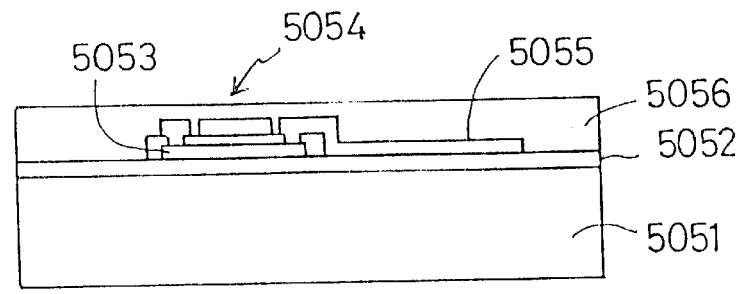

An IC process is performed in FIG. 14(B). The silicon monocrystalline semiconductor layer 5053 is patterned in a predetermined shape to provide an element region. The IC process is applied to the element region to integrate and form insulated gate field effect type transistors constituting switching elements 5054, or X driver, Y driver or the like at periphery. As a result of selectively removing the silicon monocrystalline semiconductor layer 5053, the transparent conductive film such as ITO is patterned on an exposed surface portion of the transparent insulation film 5052 to provide a pixel electrode 5055. Finally, the entire substrate is coated with a protecting film 5056.

Figure 14C:
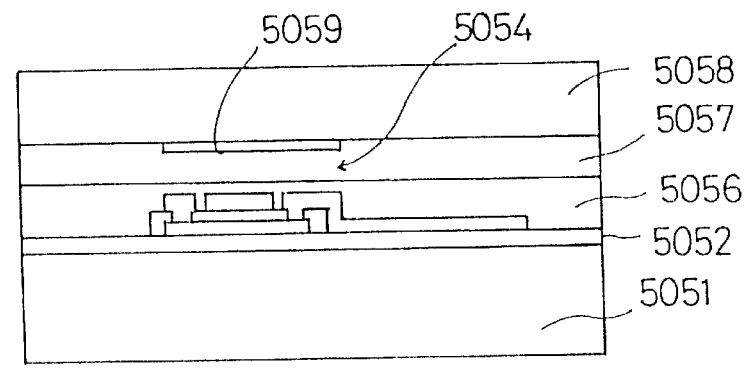
Figure 14D:
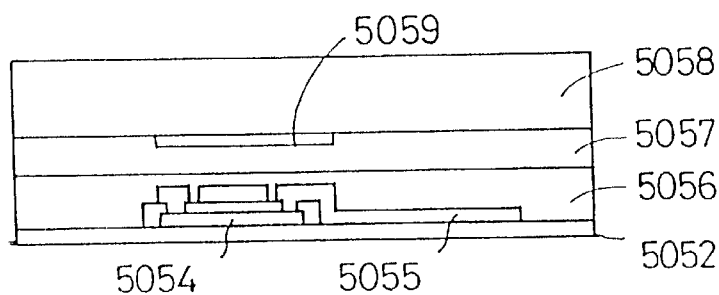

In process FIG. 14(C), a glass substrate 5058 is adhered to the above through a bonding agent layer 5057 made of silicon dioxide. At this step, a light reflective shielding film 5059 is previously patterned on a bondingside interface of the glass substrate 5058 so as to match with the switching element 5054. In process FIG. 14(D), the silicon substrate 5051 is entirely removed by etching, to expose the back surface of the transparent insulation film 5052 made of silicon dioxide. In this manner, the pixel array section including the switching elements 5054, pixel electrodes 5055 etc and the peripheral circuit section (not shown) are transferred to the glass substrate 5058 side from the silicon substrate 5051 side.

Figure 14E:
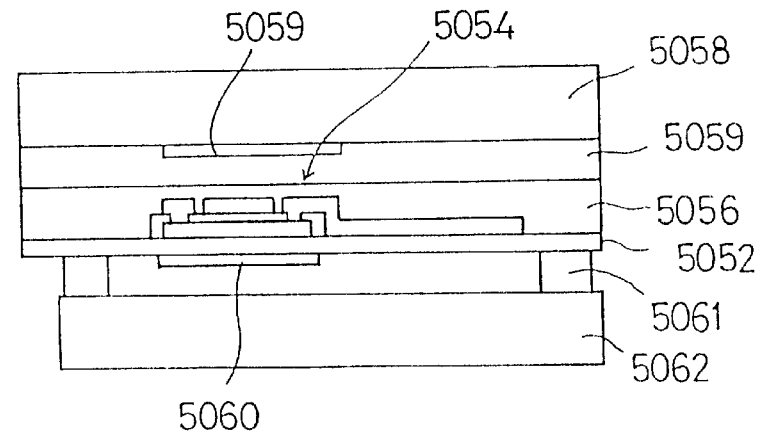

In process FIG. 14(E), a liquid crystal cell is assembled. A light reflective shielding film 5060 is patterned to an exposed surface of the transparent insulation film 5052 so as to match with the switching element 5054. Next, an opposite glass substrate 5062 is adhered thereon through a resin seal member 5061. Finally, a liquid crystal layer is filled and sealed into a gap provided between the opposite glass substrate 5062 and the transparent insulation film 5052. An opposite electrode is previously formed in the inside surface of the opposite glass substrate 5062, but not shown. Color filters are also layered depending on circumstances. In transfer construction described, since the liquid crystal cell is assembled on the extremely flat exposed surface of the transparent insulation film 5052, there can be obtained the liquid crystal panel having an upgraded uniformity of alignment and gap. The exposed flat surface is simultaneously used to easily form a circuit wiring pattern.

Figure 15:
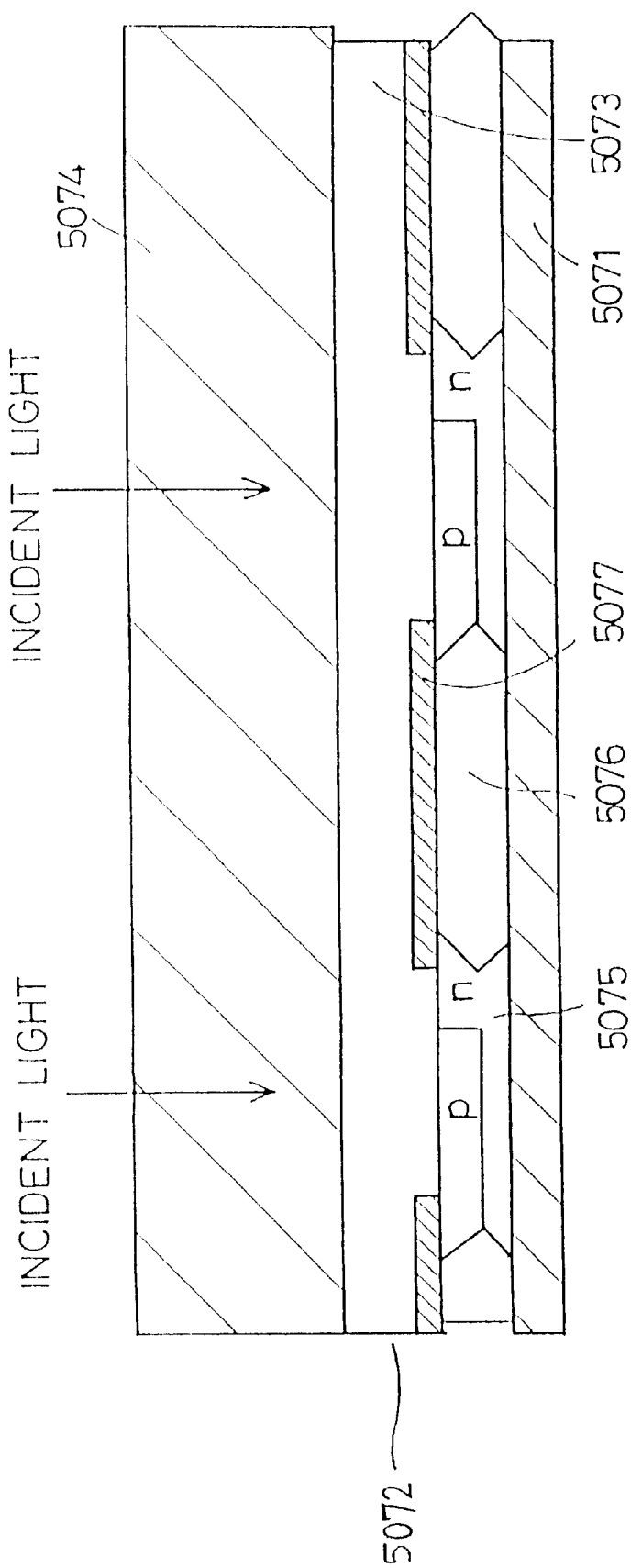
FIG. 15 is a schematic sectional view of the monocrystalline semiconductor type light valve device incorporated unitary with a solar cell.

FIG. 15 is a schematic sectional view showing a second embodiment of the monocrystalline semiconductor type light valve according to the present invention, showing the example of one incorporated with a solar cell. For easier understanding the drawing, a liquid crystal cell and an opposite substrate are omitted from the drawing. A substrate, which is used for the present light valve has a layered structure, in which a transparent insulation film 5071, a silicon monocrystalline semiconductor layer 5072, a bonding agent layer 5073, and a glass base member 5074 are sequentially layered. The present example is also of a transfer type, where the pixel array section and the peripheral circuit section (not shown) are unitarily formed on the silicon monocrystalline semiconductor layer 5072. Furthermore, the present embodiment features solar cells 5075 which are composed of PN junction diodes and formed on the silicon monocrystalline semiconductor layer 5072 to gather with the above. A plurality of solar cells 5075 are prepared and respectively insulated with each other by element separating zones 5076 made of silicon dioxide etc. Thus, the solar cells 5075 can be connected in series, and it is possible to directly take out an output voltage of a required level. To connect the respective solar cells 5075 each other, metal lines 5077 are patterned and provided on an element separating zones 5078. An incident light from the light source section (not shown) is received by the solar cells 5075 and photo-converted to produce a desired electromotive force.

Figure 16:
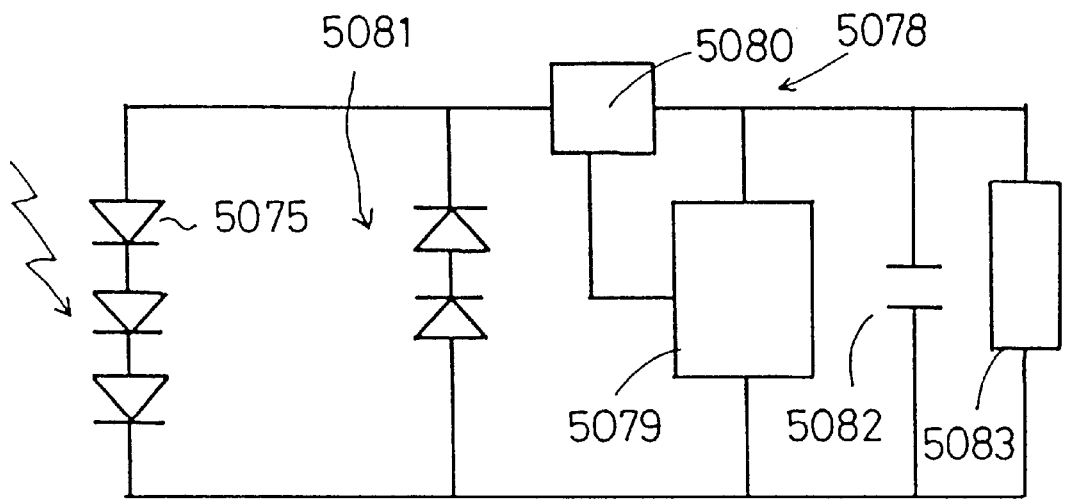
FIG. 16 is an equivalent circuit diagram of the light valve device in FIG. 5.

FIG. 16 is an equivalent circuit of a structure shown in FIG. 15, the solar cells 5075 formed of the PN junction diode is connected in series with each other by the predetermined number of pieces. An electromotive force of one solar cell is, for example, 0.7 V, and if 25 to 30 pieces of the cells are connected in series, there can directly be obtained a power supply voltage of 15 to 20 V. A constant voltage regulator circuit 5078 is connected to both end of the solar cells connected in series each other. This is a combination of a voltage detecting circuit 5079 and a voltage regulating circuit 5080. These circuits can also be integrated into the silicon monocrystalline semiconductor layer. Furthermore, at the both ends of the solar cells 5075 in series connection a protecting zener diode 5081 and a stabilizer capacitor 5082 are connected in parallel. Finally, a peripheral circuit 5083 of the monocrystalline semiconductor type light valve is connected inside to the both ends of the stabilizer capacitor 5082 to receive the power supply voltage. In this embodiment, a part of light from the light source is photoconverted, to self-supply the power supply voltage for the light valve, and to intend an improvement of energy utilization efficiency.

Figure 17:
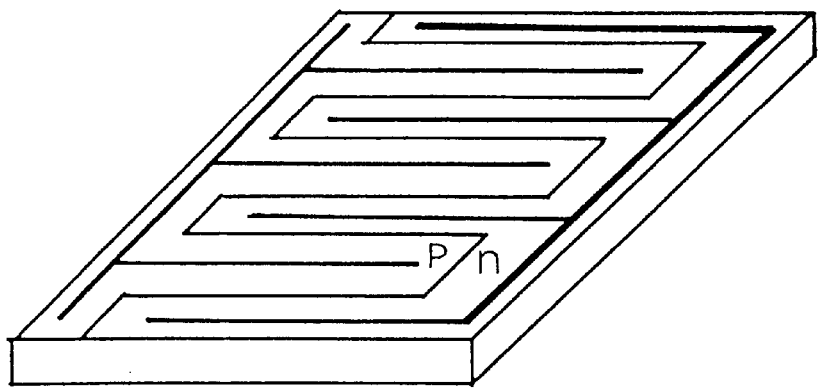
FIG. 17 is a perspective view showing a solar cell incorporated into the light valve device in FIG. 5.

FIG. 17 is a schematic view showing a pattern form of the individual solar cells formed on the silicon monocrystalline semiconductor layer. In the drawing, a P type region and an N type region are matched in a comb tooth shape with each other to contact at a larger area therefor. The electrodes are provided along the comb tooth pattern. The element separation zones are provided by partial oxidation of the silicon monocrystalline semiconductor layer to completely separate the solar cells having such constructions with each other, this enables a series connection.

Figure 18:
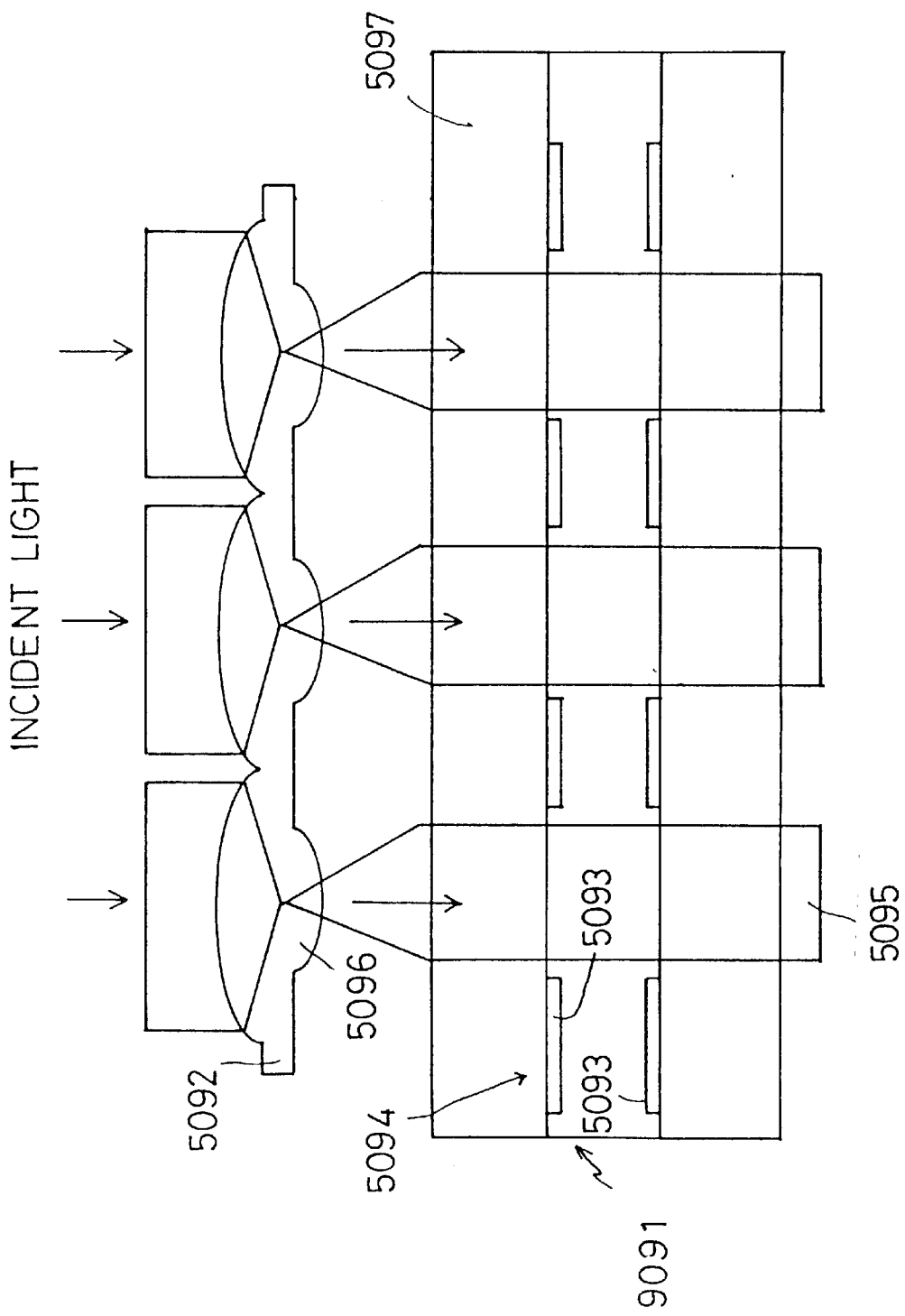
FIG. 18 is a simplified view showing monocrystalline semiconductor type light valve device attached with a micro-lens array.

FIG. 18 is a schematic sectional view showing a third embodiment of the monocrystalline semiconductor type light valve according to the present invention. A micro-lens array 5092 is loaded in adjacent to a light valve 5091. For easier understanding the light valve 5091, the drawing schematically shows a non-pixel section 5094 shielded by a light reflective shielding film 5093 and a pixel section 5095 where pixel electrodes are positioned. Individual micro-lenses 5096 contained in a micro-lens array 5092 are provided so as to match with the pixel section 5095. A light incident from the light source on an entire surface of the micro-lens array 5092 is converged by the respective micro-lenses 5096, and selectively irradiates only the pixel section 5095. Therefore, the light from the light source becomes an effective light flux to irradiate the entire pixel section 5095, and not irradiates the non-pixel section 5094. Thus, a brightness of the projected image is remarkably improved. In such construction, the light amount absorbed by the light valve 5091 decreases corresponding to the increase in transmitted light amount, thus the temperature rise can be prevented effectively.

Figure 19:
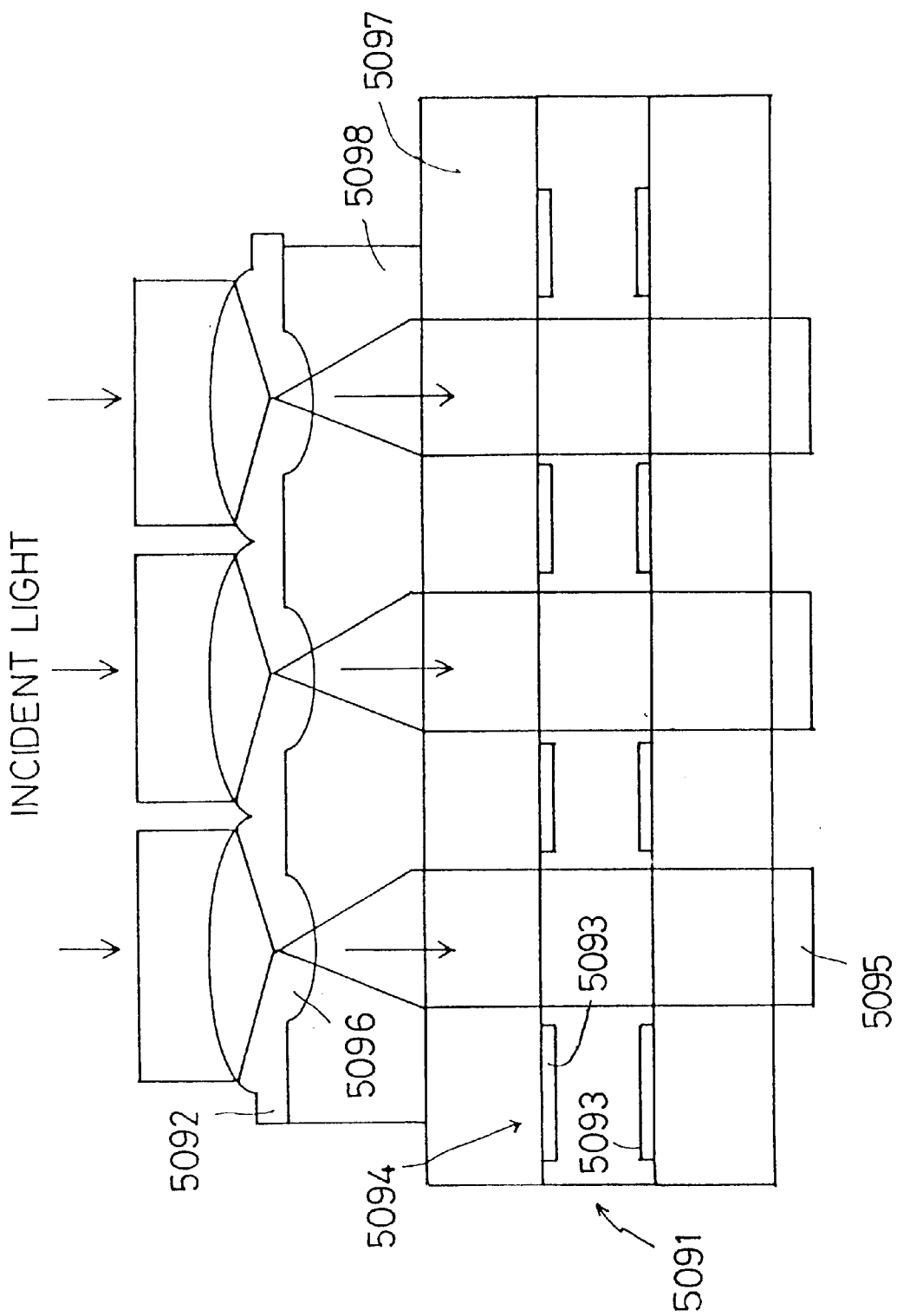
FIG. 19 is a sectional view showing a monocrystalline semiconductor type light valve device attached with a micro-lens array as in FIG. 18.

FIG. 19 is a schematic diagram showing a modified example of the third embodiment-as shown in FIG. 18, where this has basically the same construction. For easier understanding, the corresponding reference numerals are given to the corresponding parts as those in FIG. 18. The different point is that a transparent bonding layer 5098 is provided between the micro-lens array 5092 and the substrate 5097 of light valve 5091. The transparent bonding layer 5098 has a smaller refraction index than that of an optical member constituting the micro-lens array 5092, hence a condensing rate of the light from the light source can be improved more. The micro-lens array 5092 can be formed by injection molding. Otherwise, a micro-lens array of refraction index distribution type can be employed.

Figure 20:
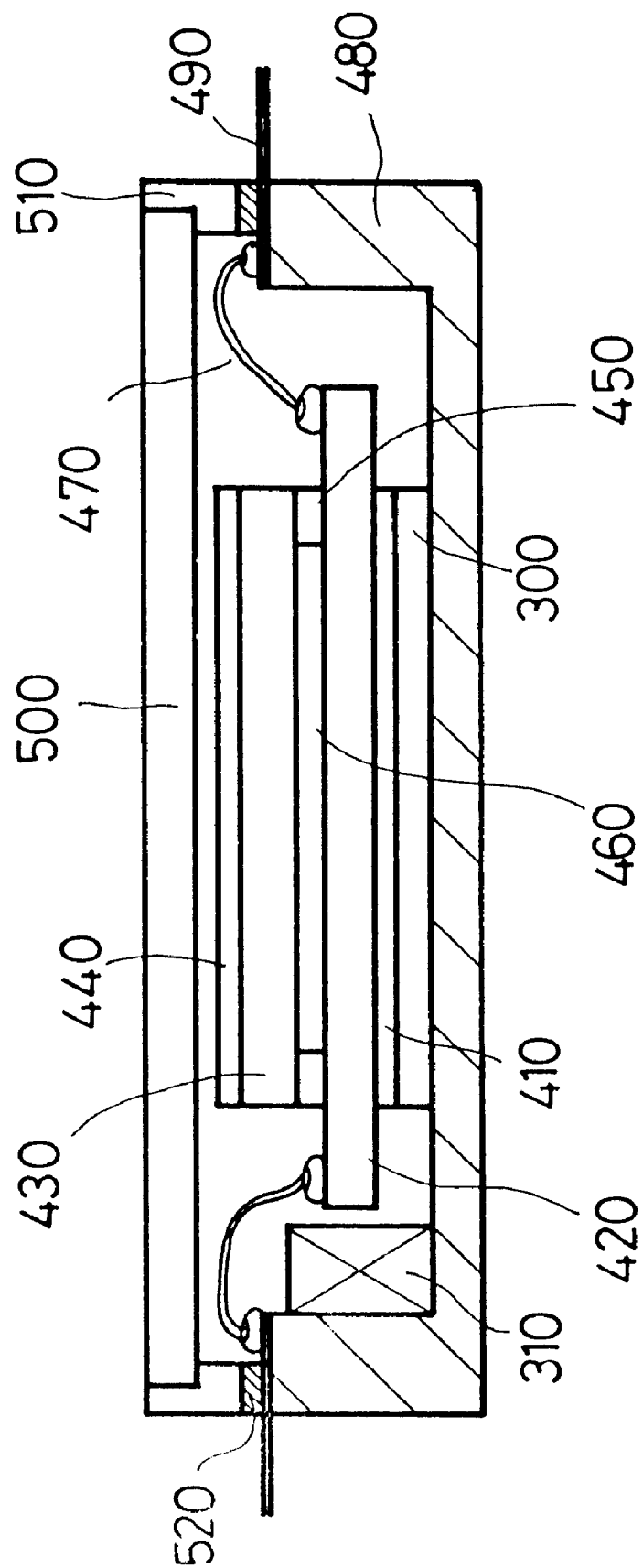
FIG. 20 is a sectional view showing an embodiment of a compact-size image display device of the present invention.

FIG. 20 is a sectional view of a compact size image display device of the present invention. In FIG. 20, a driving circuit and a peripheral circuit etc formed in the monocrystalline silicon thin film layer, liquid crystal 460 sealed into a gap between a first transparent substrate 420 having a pixel array section and a second transparent substrate 430 having a common electrode, and a display element composed of polarizers 440, 410 provided on and under the first, second transparent substrates 420, 430, together with an EL light source element 300 and a transformer 310, are provided inside a first seal substrate 480 of a tightly sealed type and made of ceramic material, and fixed by bonding agent. A connection lead electrode 490 is provided on the first seal substrate 480. The connection lead electrode 490 is connected, for example, to an input terminal electrode of A1 provided on the first transparent substrate 410 by wire bonding a thin gold line 470. The second seal substrate 500 for covering the first seal substrate 480 has a construction that transparent substrates such as plastic or glass are held by insulator 510 of plastic or ceramic materials. The first and second seal substrates 480, 500 tightly seal the display elements and the light source elements 300 in an nitrogen atmosphere by a seal agent 520.

Figure 21:
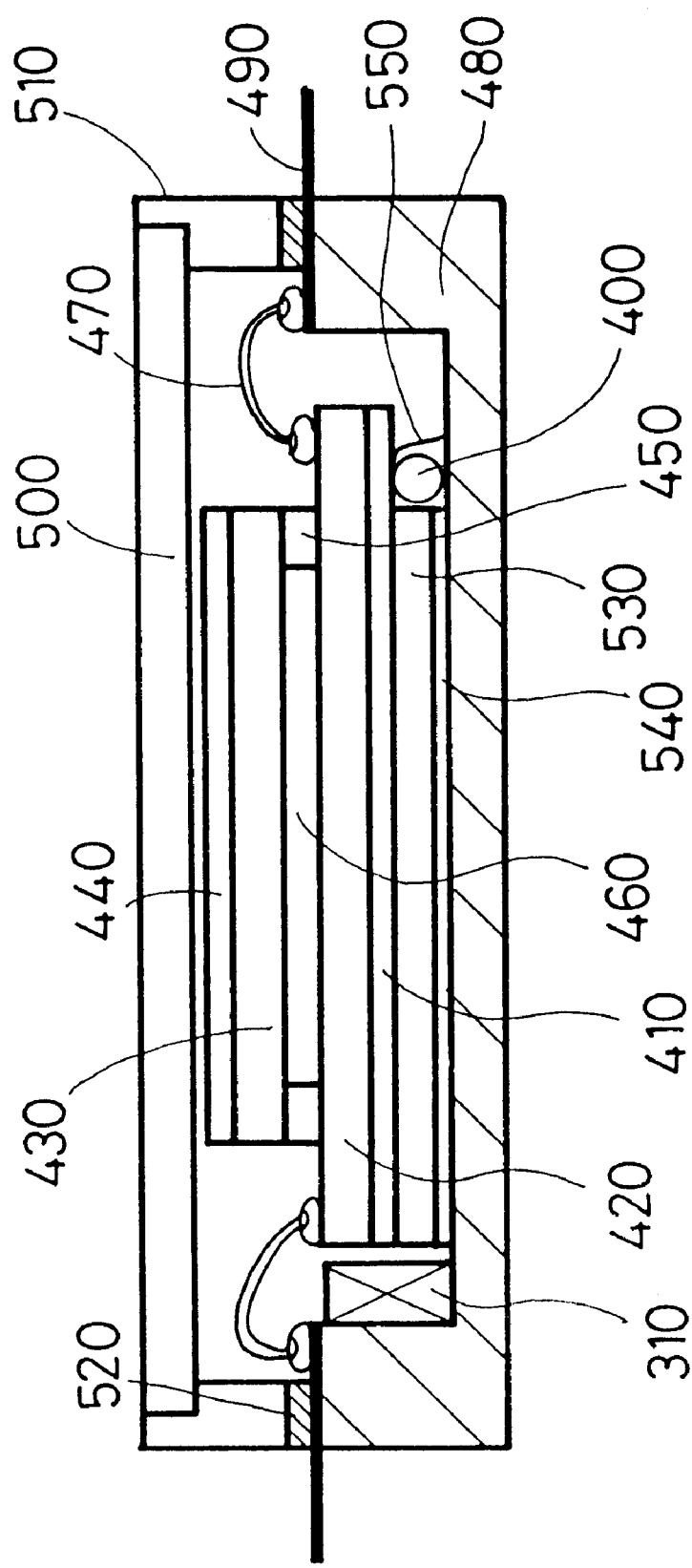
FIG. 21 is a sectional view showing another embodiment of a compact-size image display device of the present invention.

FIG. 21 is a sectional view in case of using a compact size fluorescent lamp (FL light source element) 400 as a light source element. The same numerals are given to the similar elements as those in FIG. 20, thus the same explanations are omitted. In FIG. 21, a metallic condenser plate 550, a FL light source element 400, a photoconductive plate 530, and a reflector 540 are not included embodiment in FIG. 20. The FL light source element 400 is provide on lateral edge of the display element. A radiated light from the FL light source element 400 is converged by the metallic condenser plate 550 and introduced to the photoconductive plate 530. A light conducted by the photoconductive plate 530 is reflected by the reflector 540 to irradiate the display element. The embodiments of the present invention are not limited to the applications for the view finders of the 8 mm cameras, it can be applied to home (residence) monitors for crimes prevention, or various monitors used in industries, and like applications.

FIG. 22 a sectional view showing a mount structure of a stereoscopic image display device of the present invention. In FIG. 22, a display element, in which liquid crystal 2016 of electrooptic material is sealed by a first transparent substrate 2401 and a second transparent substrate 2421, is provided inside a casing 2402 formed of insulator such as ceramic material or plastic material, and fixed by a bonding agent 2415. The casing 2402 is provided with an electrode lead 2403 for introducing a power supply voltage or required electric signals, and connected to the driving circuit and the other peripheral circuit formed on the first transparent substrate 2401 by thin lines of Au wires. A lower portion of the fixed display element is composed of a light source element 2407, a photoconductive plate 2406 for conducting incident light, a reflector 2408 for reflecting light, a light condenser plate 2420 for converging light, and light source element parts fixed on a holding plate 2409 for holding these described.

Over the display element is provided with transparent cover materials 2413 made of glass or plastic material and a protecting frame 2412 formed of ceramic or plastic material holding the cover material 2413 and protecting the display device by covering thereabove. The protecting frame 2412 is adhered by a bonding agent 2414 to protect the display element placed within the casing 2402. The light source element parts constitute a unitary structured display device of the display elements and the light source elements by fixing mount holes 2410 of the holding plate 2409 and mount holes 2405 of the casing 2402 with screws 2411. The transparent cover material 2413 uses any of transparent materials, but lenses made of plastic or ceramic can be used to optically enlarge displays for better observation.

FIGS. 23(A) to 23(C) are schematic views showing a basical construction of an IC package type monocrystalline semiconductor light valve element according to the present invention. FIG. 23(A) is a perspective view, FIG. 23(B) a sectional view, and FIG. 23(C) a plan view. In FIG. 23(A), the present element has an IC package construction that a light valve cell 4001, connector terminals 4002, and a package member 4003 are unitarily formed. In the light valve cell 4001, only the pixel array section thereof can be visually observed from a window 4004, and the other portions are shielded by a structure of the package member 4003. The portions other than the pixel array section are completely molded for shielding to prevent incident light into the peripheral circuit and to physically enhance the inside light valve cell. The package member 4003 is made, for example, of a black molded resin product. Otherwise, a ceramic mold product may also be used, and in this case, the inside light valve cell 4001 is adhered into a unit shape by resin bonding. The connector terminals 4002 are made of a plurality of connector pins, and can easily be mounted on the circuit substrate by soldering etc as in the general IC device connector pins.

As shown in sectional view FIG. 23(B), the light valve cell 4001 composed of a pair of substrates 4005, 4006 opposingly arranged each other and at least either of which is transparent, and an electrooptic material 4007 arranged in a gap between the substrates For an electrooptic material 4007 can be used, for example, liquid crystal and the like. The pixel array section and the peripheral circuit section for driving it are unitarily provided on an inside surface of the substrate 4006. The opposite electrode is provided on an inside surface of another substrate 4005. A color filter can be formed overlapped with the opposite electrode depending on circumstances. The peripheral circuit section is integrally formed on the monocrystalline semiconductor layer provided on the electric insulation base member. The light valve cell having such a construction is hereinafter referred to as "a monocrystalline semiconductor type light valve cell". The light valve 4001 is completely enclosed by the package member 4003 to obtain physically compact enhancement structure. The windows 4004 opened on an upper and a lower main surfaces of the package member 4003 are fit unitarily with protecting glass members 4008 respectively. The connector terminals 4002 have one end electrically connected to the peripheral circuit section of the light valve cell 4001 and another end protruding from the package member 4003.

As shown in plan view FIG. 23(C), only a pixel array section 4009 of the light valve cell is exposed from the main surface of the package member 4003 through the window 4004, and the peripheral circuit section is completely shielded from light. The pixel array section 4009 is covered by the protecting glass member 4008 as described to prevent the pixel array section from braking. The IC package type monocrystalline semiconductor light valve element thus made integrated or solid is very compact and has a high reliability and also is to handle and has a simple mount structure. For example, the connector terminals 4002 are incorporated into socket to simultaneously achieve mounting and electrical connection.

Various, modification, or concrete examples or improved examples of the IC package type monocrystalline semiconductor light valve element according to the present invention are described referring to FIGS. 24 to 34. The basic construction thereof is the same as the IC package type light valve element shown in FIGS. 23(A) to 23(C), and for easier understanding, corresponding parts are given of the same reference numerals as those in FIGS. 23(A) to 23(C)

Figure 24:
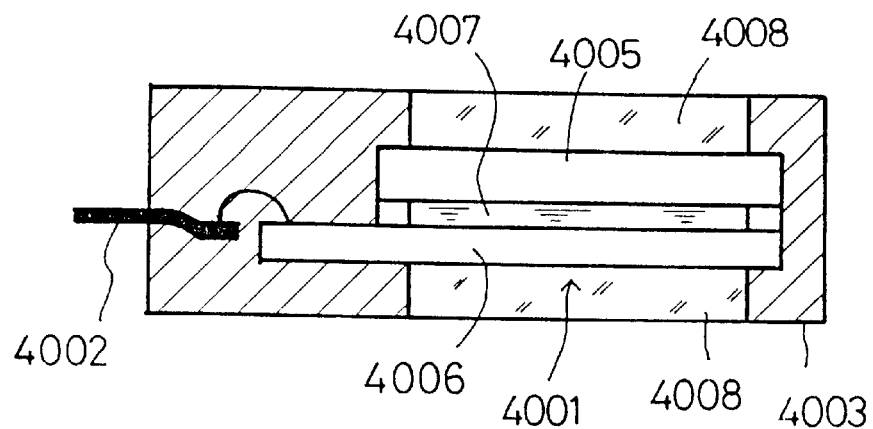
FIG. 24 a sectional view showing a first embodiment of an IC package type monocrystalline semiconductor light valve device.

In the construction in FIG. 24, the connector terminal. 4002 is provided to protrude from the lateral end surface of the package member 4003 in parallel with the light valve cell 4001. Such connector terminal arrangement is suitable for direct assembling the IC package type light valve element into a socket. The connector terminal 4002 includes a lead frame, one end thereof is electrically connected to the peripheral circuit section of the light valve cell 4001 by wire bonding. Concretely, it is wire connected to the take-out electrode (see 4054 in FIGS. 12(A) to 12(E)) provided on an exposed surface of the substrate 4006 of the light valve cell 4001. The light valve cell 4001 and the lead frame are made into a unitary shape to be set in metallic die, thus the package is completed by injection-molding with black mold resin.

Figure 25:
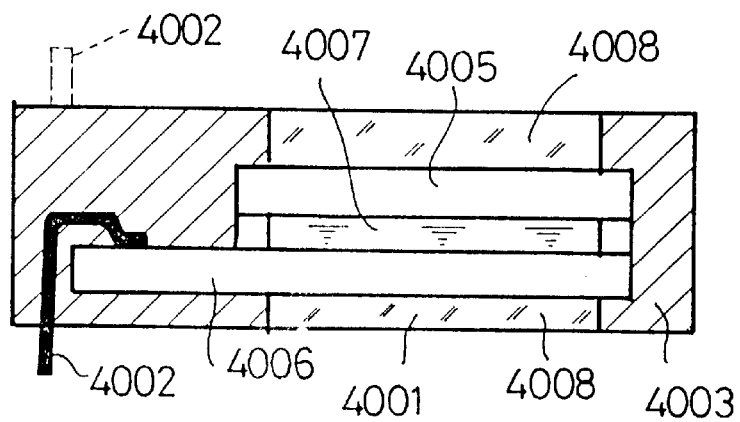
FIG. 25 is a sectional view showing a second embodiment similarly.

In the construction example of FIG. 25, the connector terminals 4002 are provided intersecting orthogonally to the light valve cell 4001 and protruding from the main surface on a lower side of the package member 4003. One end of the connector terminals 4002 is welded on the take-out electrode formed on the exposed surface of the substrate 4006 of the light valve cell 4001. The arrangement of the connector terminals are suitable, for example, for loading and soldering the package on the circuit substrate. As shown by dotted lines, the connector terminals 4002 can be provided protruding from the upper-side main surface of the package member 4003, not only from the lower-side main surface thereof.

Figure 26:
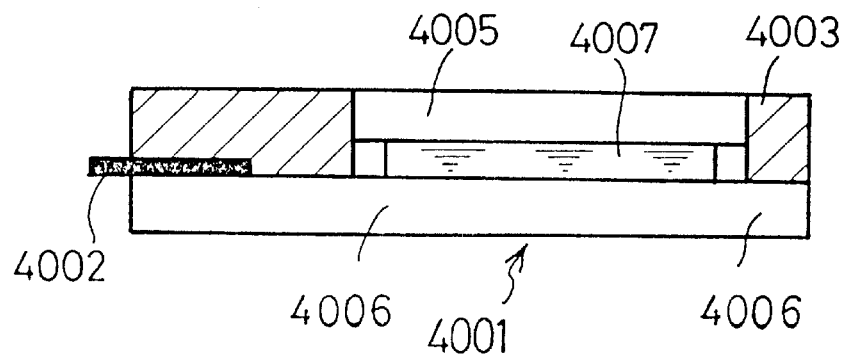
FIG. 26 is a sectional view showing a third embodiment similarly.
Figure 27:
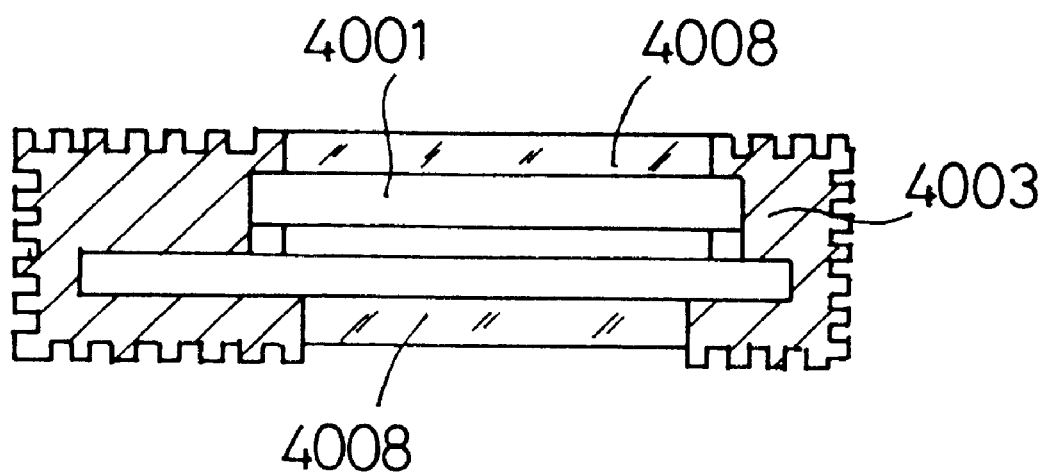
FIG. 27 is a sectional view showing a fourth embodiment similarly.

In the construction example in FIG. 26, the package member 4003 has a thickness substantially equal to that of the light valve cell, the package member of this constriction can be further made thinner compared to the construction as formerly described. However in this construction, a pair of the glass substrates 4005, 4006 of the light valve cell 4001 are exposed from the package member 4003, the protecting glass member is removed.

Figure 29:
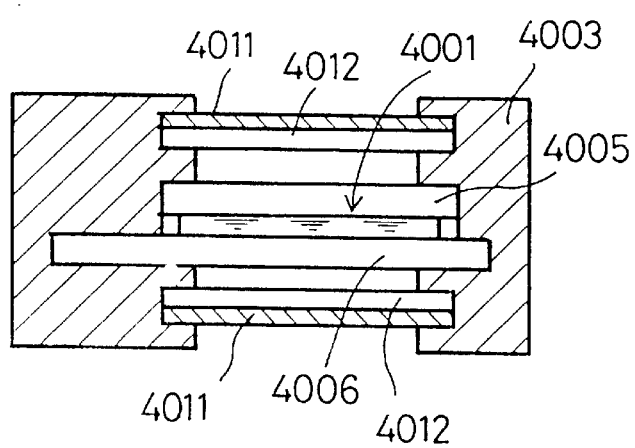
FIG. 29 is a sectional view showing a sixth embodiment similarly.

In the construction example in FIG. 29, the surface of the package member 4003 is made uneven, the surface area increases compared to the construction example formerly described. The surface unevenness is provided for the purpose of heat radiation, this advantageously prevents deterioration of the light valve cell due to heat generated in the package. In case of assembling the IC package type light valve element into the image projector, the temperature rise in the package due to irradiation of an intensive light from the light source can effectively be prevented.

Figure 28:
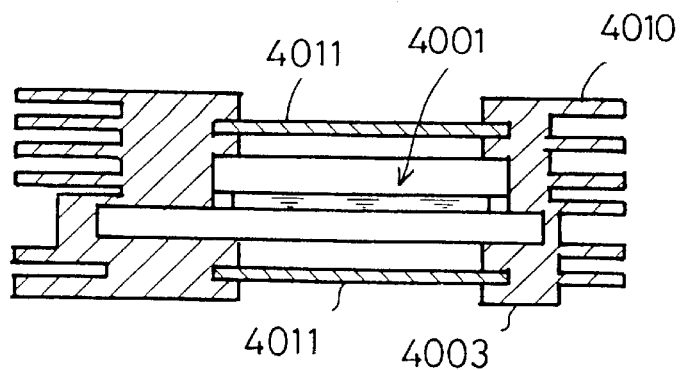
FIG. 28 is a sectional view showing a fifth embodiment similarly.

In the construction example of FIG. 28, a cooling fin 4010 is provided on outer surface of the package member 4003. The cooling fin 4010 can be provided at the same time of injection-molding the package member 4003. An infrared radiation filter 4011 for heat ray cut is attached on windows of the package member 4003 in stead of the protecting glass member, the temperature rise inside the package can more effectively be suppressed.

In the construction example of FIG. 29, the infrared radiation filters 4011 are laminated on polarizer 4012 respectively which are disposed apart from the substrates 4005, 4006 of the light valve cell 4001, and prevents conduction of an absorbed heat by the infrared radiation filter 4011.

Figure 30:
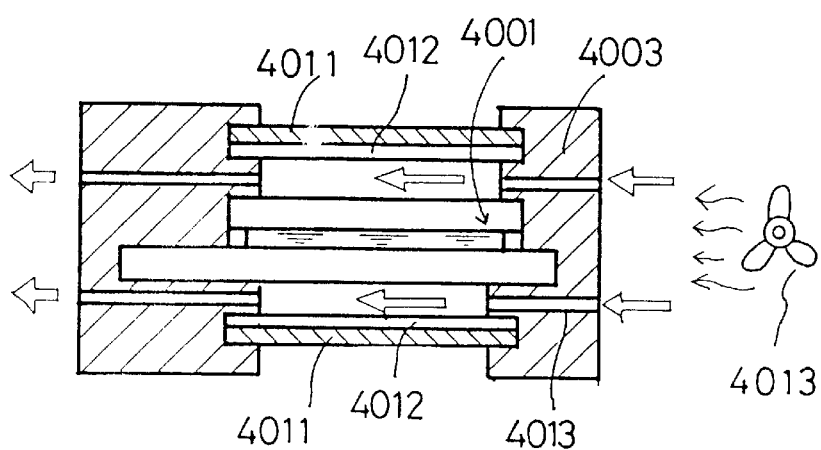
FIG. 30 is a sectional view showing a seventh embodiment similarly.

In the construction of FIG. 30, the construction shown in FIG. 29 is more improved to considerably raise cooling effect. Through holes 4013 to be a path of coolant are provided in the package member 4003. The coolant blasted by force with a fan 4014 and the like passes through the through holes 4013 to travel through a gap between the light valve cell 4001 and the polarizer 4012 and to be discharged. This enables to cool the light valve cell 4001 using gas.

Figure 31A:
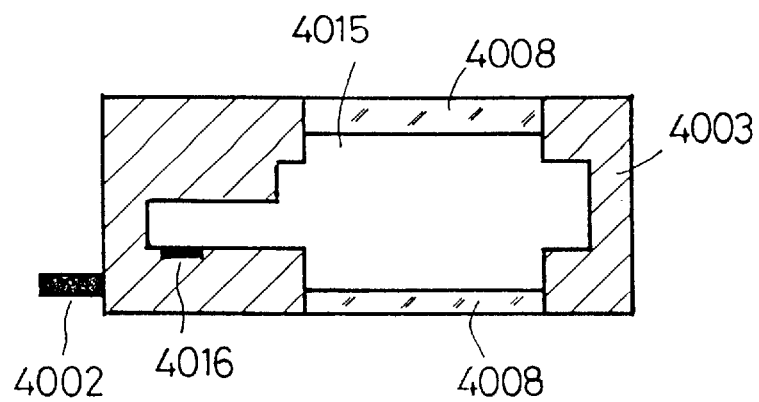
FIGS. 31(A) and 31(B) are sectional views showing an eighth embodiment similarly.
Figure 31B:
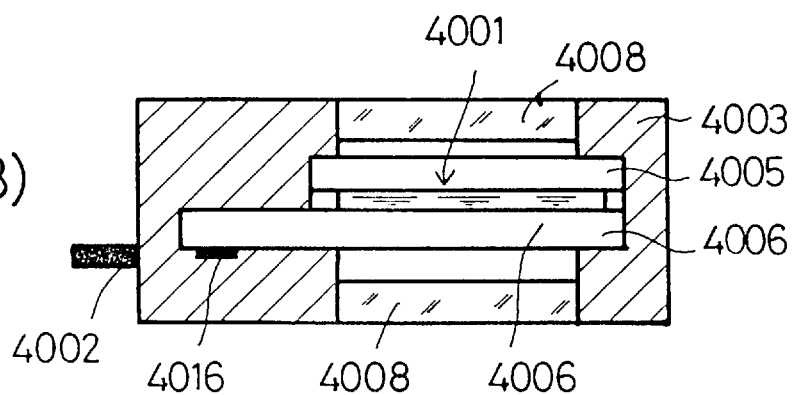

In the construction examples of FIGS. 31(A) and 31(B), the package member 4003 in FIG. 31(A) includes a recess portion 4015 releasably containing the light valve cell. In the construction example, solely the connector terminals 4002 and the protecting glass member 4008 are previously unitarily molded by resin to prepare the package member 4003. Electrode pads 4016 conducting to the connector terminals 4002 are provided on predetermined positions of a stepwise portion in the recess portion 4015. In FIG. 31(B), the light valve cell 4001 is fit in the recess portion 4015 to extremely easily complete the package. With the light valve cell 4001 inserted, the take-out electrode provided on the substrate 4006 and the pads 4016 described are contacted each other to obtain electric connection. This construction example, unlike the example previously explained, is exchangeable as in a cassette type because the package member 4003 and the light valve cell 4001 are not made into unitary shape obtained by adhesion or molding.

Figure 32:
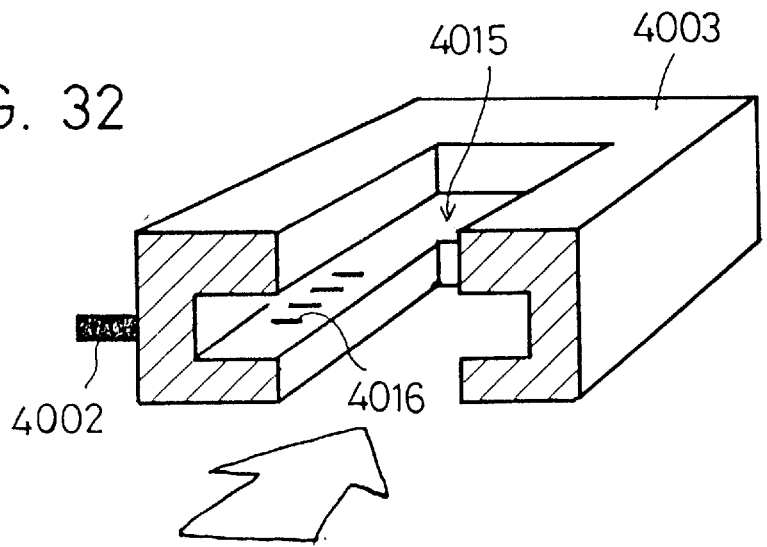
FIG. 32 is a perspective view showing a ninth embodiment similarly.
Figure 33:
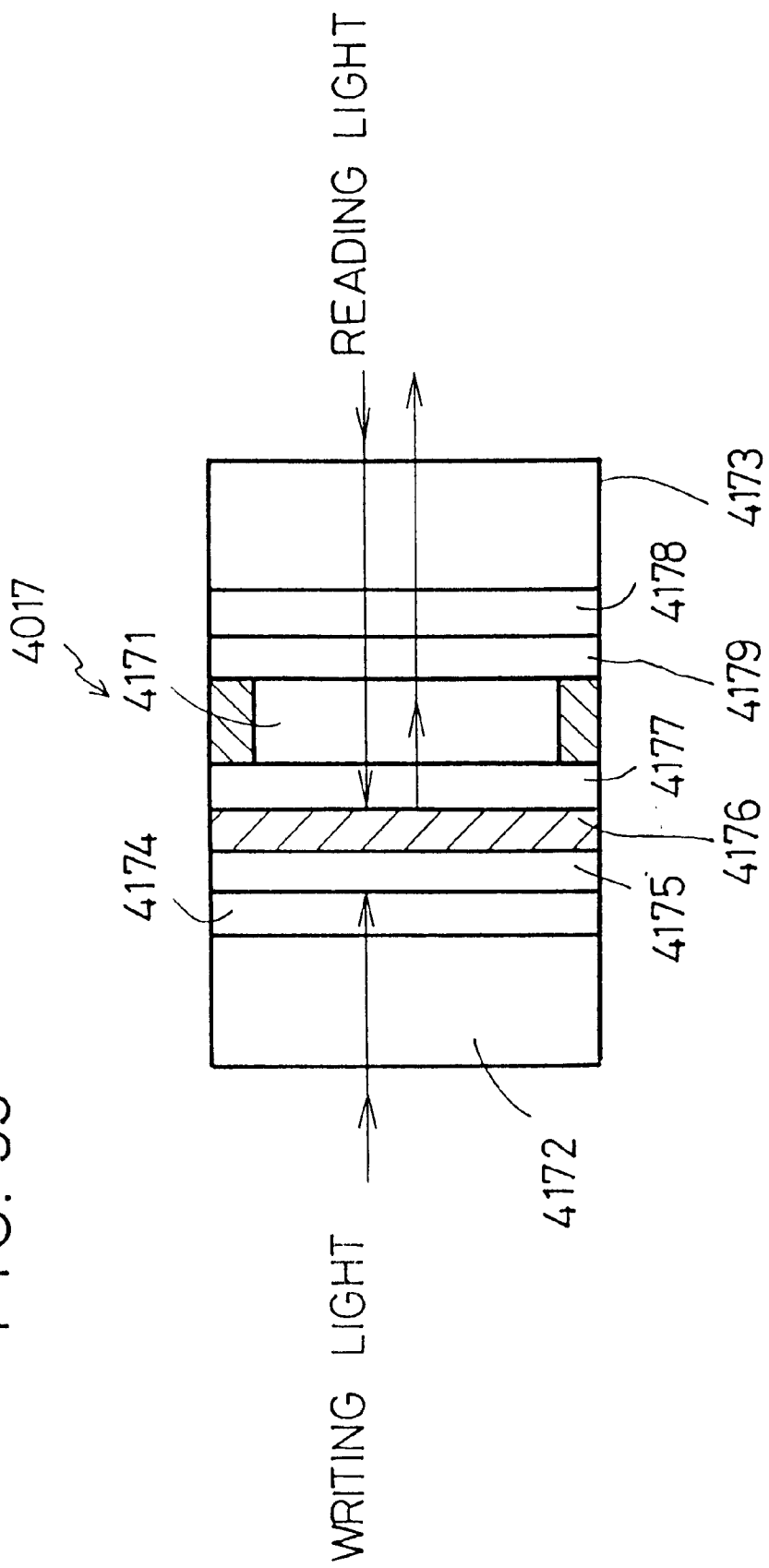
FIG. 33 is a schematic sectional view showing an optically addressed type light valve cell.

The construction example in FIG. 32 is basically the same as that in FIGS. 31(A) and 31(B). In this example, the construction of the package member 4003 is more simplified, where a light valve cell unit, which is previously attached with the polarizer or protecting glass or the like, is inserted, as it is, into the recess portion 4015. In this construction example, the light valve cell or the panel can be freely exchanged, and when a light valve cell written previously therein with display data is used, it can be used as in a slide projector.

Finally, an IC package construction is described, in which a monocrystalline semiconductor light valve cell of an electrically addressed type and the light valve cell of an optically addressed type are unitarily assembled. For easier understanding this construction example, an optically addressed type light valve cell 4017 is explained referring to FIG. 33. The optically addressed type light valve cell 4017 has a flat panel structure in which liquid crystal 4171 is sandwiched a pair of transparent substrates 4172 and 4173. The liquid crystal 4171 can be used ferroelectric liquid crystal having a memory function. A write light is incident on an outer surface of the transparent substrate 4172, and a read light is incident on outer surface of the other transparent substrate 4173. The inner surface of the write-side substrate 4172 is laminated with sequentially a transparent substrate 4174, a photoconductive film 4175 formed of amorphous silicon and the like, a dielectric mirror film 4176, and an alignment film 4177. On the inner surface of the read-side substrate 4173 is formed sequentially a transparent substrate 4178 and an alignment film 4179. The ferroelectric liquid crystal 4171 sandwiched by the alignment films 4177 and 4179 exhibits a bistable state. Such bistable state can be switched by voltage applying.

The write light is irradiated in a state where a predetermined voltage is applied to a pair of the transparent electrodes 4174 and 4178, then a resistance of the photoconductive film 4175 is locally varied, and an effective voltage exceeding a threshold value is applied to the ferroelectric liquid crystal 4171 to enable switching the stable state. In this way, image information is written into the ferroelectric liquid crystal 4171. This optically addressed type light valve cell exhibits a considerably high accuracy and has a resolution close to that of the photography film. To read out the written image information, the linearly polarized read light is irradiated. The read light passes through the ferroelectric liquid crystal 4171 to be modulated and then is reflected by the. dielectric mirror film 4176. This reflection light is detected as a change in light intensity by passing through the polarizer (not shown).

Figure 34:
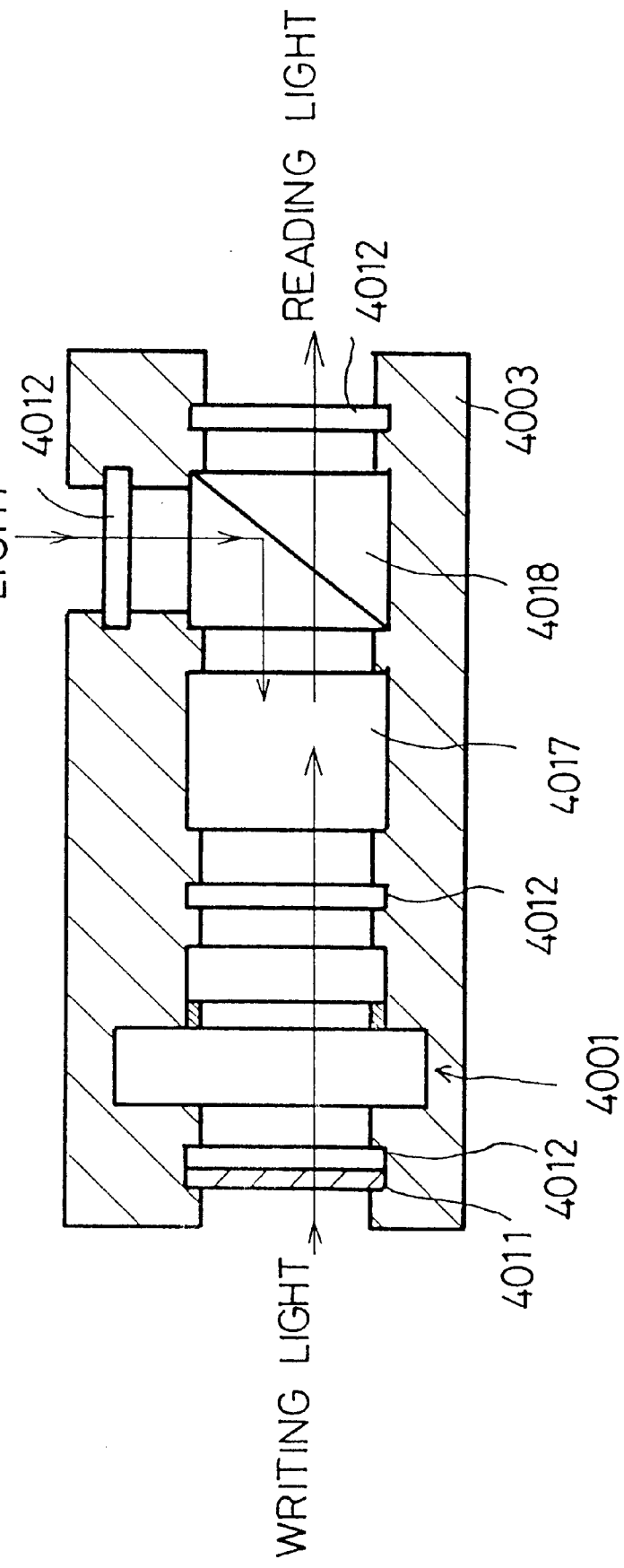
FIG. 34 is a sectional view showing a particular embodiment of an IC package type monocrystalline semiconductor light valve device of the present invention, where an optically addressed type light valve cell is incorporated together with a monocrystalline semiconductor light valve cell in FIG. 33.
Figure 35:
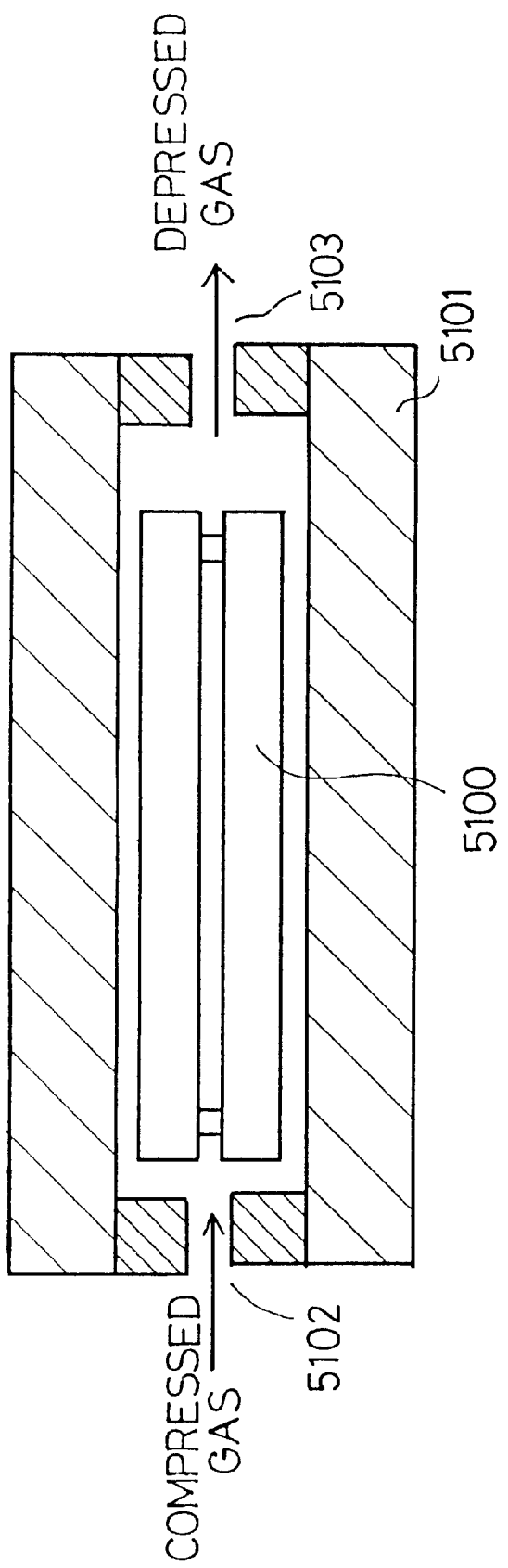
FIG. 35 is a sectional view showing a projector monocrystalline semiconductor type light valve device including a cooling means.

FIG. 34 shows the package structure in which the above-mentioned optically addressed type light valve cell and the electrically addressed type monocrystalline semiconductor light valve cell are assembled in adjacent to each other. The optically addressed type light valve cell 4017 is disposed substantially at a center portion of the package member 4003. The monocrystalline semiconductor light valve cell 4001 is arranged at the read-side. One surface of the light valve cell 4001 is arranged thereon with a layered lady of the infrared radiation cut filter 4011 and of polarizer 4012, and the other surface is arranged thereon with the polarizer 4012. A beam splitter 4018 is assembled on the read-side of the optically addressed type light valve cell 4017. The polarizers 4012 are attached on the read light input-side and the read light output-side of the beam splitter 4018 respectively.

The electrically addressed type light valve cell 4001 and the optically addressed type light valve cell 4017 are combined with each other to obtain various functions and advantages. For example, image information can be written into the liquid crystal light valve cell 4017 through the monocrystalline semiconductor light valve cell 4001 by electric signals. When ferroelectric liquid crystal material is used for the liquid crystal light valve cell 4017, the liquid crystal light valve cell 4017 can operate as a memory device. Although the light valve cell 4017 as a single unit is cope only of optical addressing, combining it with the light valve cell 4001 the electrically addressing is available. In the other words, a control of read light can be performed by the electric signals. The ferroelectric light valve cell 4017 can record the image information even by weak write light. Therefore, a monocrystalline semiconductor light valve cell 4001 arranged in front of it does not require durability for intensive light. In the construction in FIG. 34, when the intensive light for a read light input is used, light intensity amplification is available. Thus, it is advantageously applied to a compact type projector and the like.

The image displayed on the monocrystalline semiconductor light valve cell 4001 is collated with the image recorded in the optically addressed type light valve cell 4017 to enable optical parallel processing. This therefore processes a large amount of information at a shortened time, which can be applied to a optical computer. As hereinbefore described, the light valve cell using the ferroelectric liquid crystal is considerably highly accurate, and to sufficiently utilize its capability, a highly precise panel as an electrically addressed type light valve cell is required, a pixel size must be equal to or less than 5 to 10 $\mu$m. In this respect, the monocrystalline semiconductor type light valve cell 1 is an only device capable of satisfying such condition. In FIG. 34, the liquid crystal light valve cell 4017 and the monocrystalline semiconductor light valve cell 4001 are constructed with one body type device, however, the monocrystalline semiconductor light valve cell 4001 can be separated from the liquid crystal light valve cell 4017 with interposing a condensing lens.

A projector light valve including various cooling means is described as an example of the present invention referring to FIGS. 35 to 38. In a concrete example in FIG. 35, a cooling means includes an adiabatic container 5101 containing a monocrystalline semiconductor type light valve 5100. The adiabatic container 5101 includes an inlet port 5102 for introducing compressed gas and an outlet port 5103 for discharging depressured gas to effectively perform adiabatic expansion cooling. The compressed gas is supplied, for example, from a pump, the depressured gas is absorbed through a vacuum system.

Figure 36:
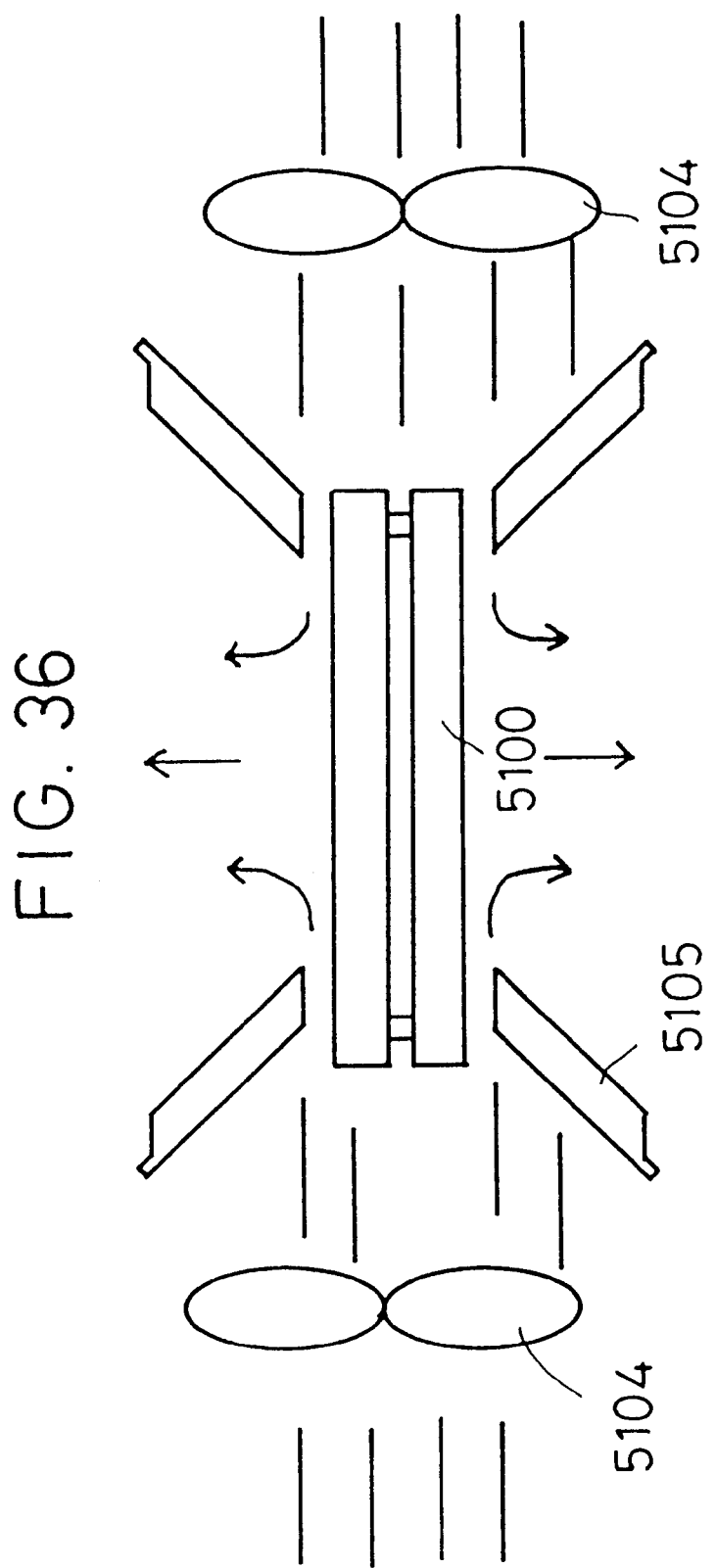
FIG. 36 is similarly a schematic view showing a projector monocrystalline semiconductor type light valve device including a cooling means.

In concrete example of FIG. 36, the cooling means comprises fans 5104 for blowing the cooling gas to the monocrystalline semiconductor type light valve 5100. The fans 5104 are provided on both-sides of the light valve 5100 respectively to force the cooling gas toward the light valve 5100. Thus blown cooling gas is introduced along guides 5105 to effectively cool the both upper and lower surfaces of the light valve 5100.

Figure 37:
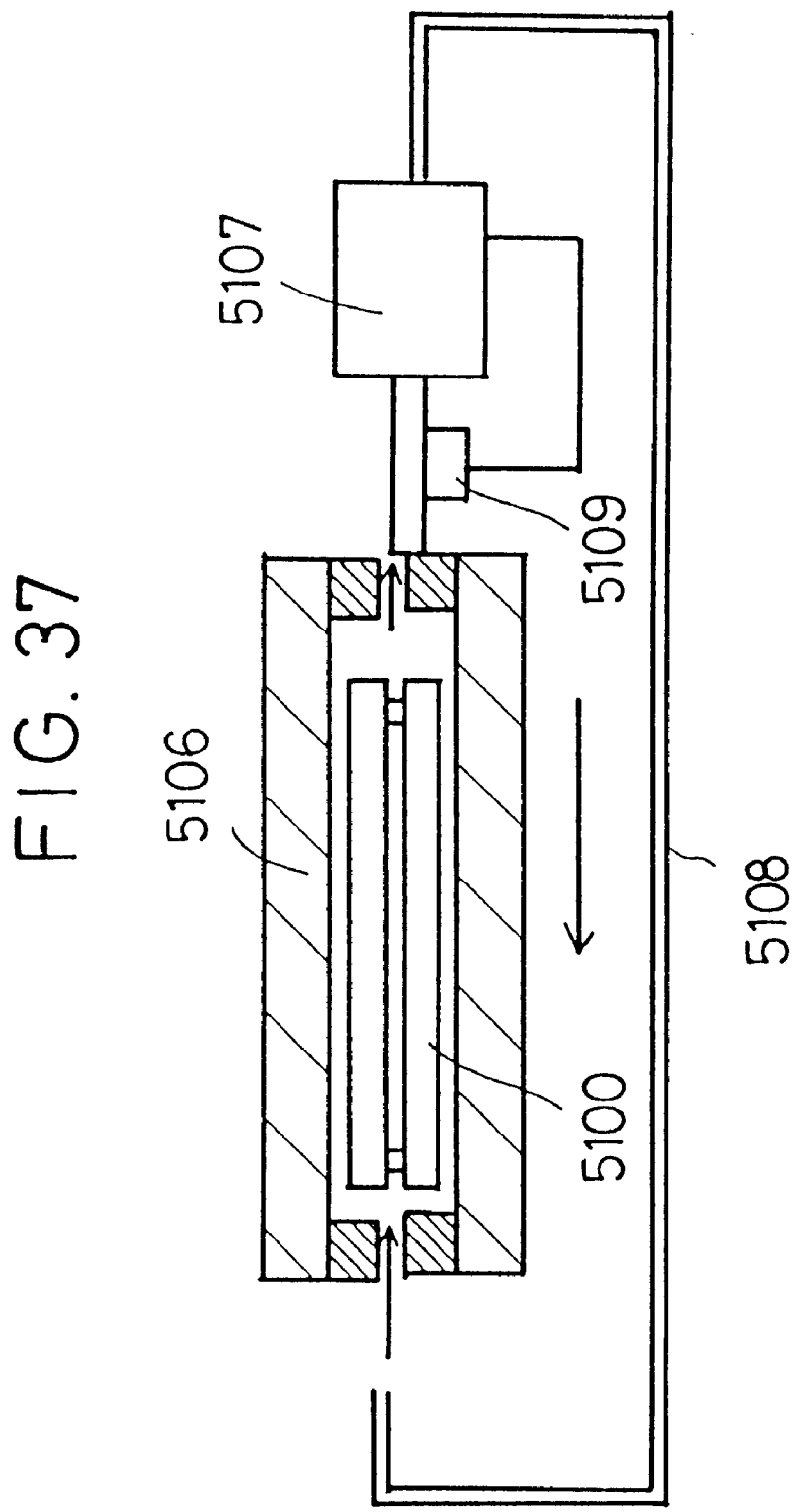
FIG. 37 is similarly a schematic view showing a projector monocrystalline semiconductor type light valve device including a cooling means.
Figure 38:
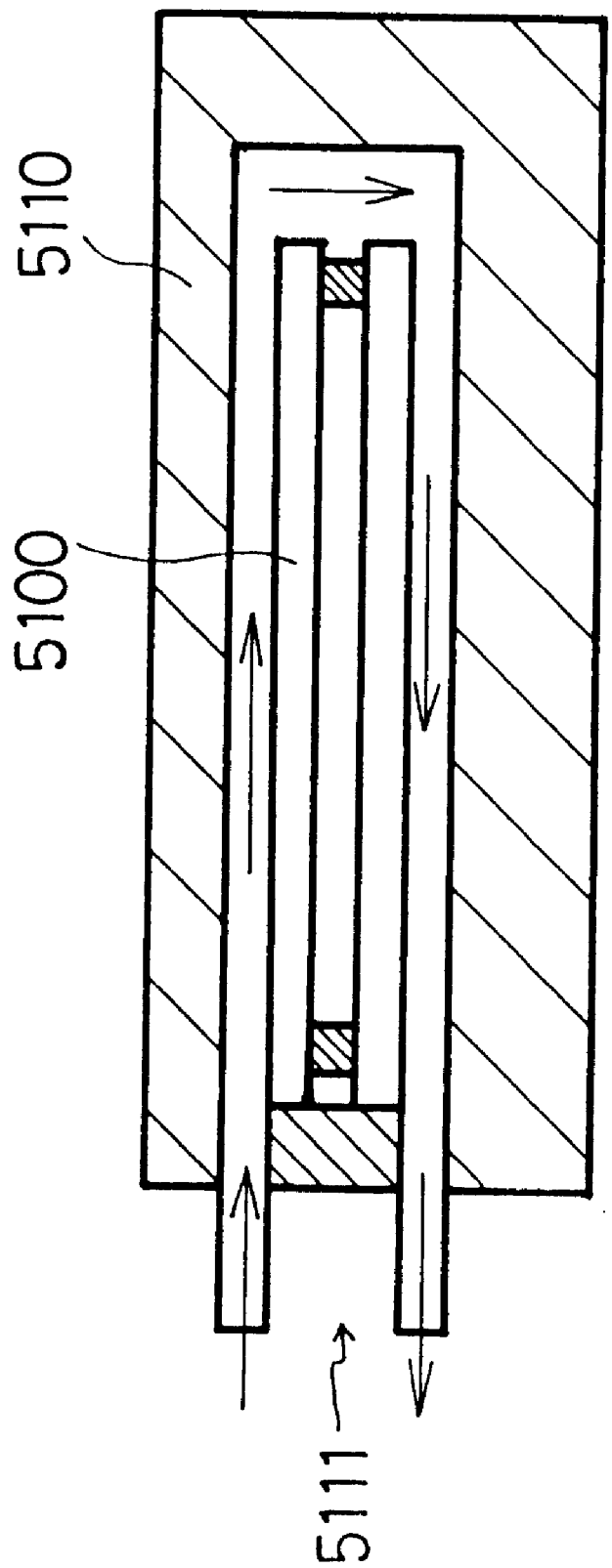
FIG. 38 is similarly a schematic view showing a projector monocrystalline semiconductor type light valve device including a cooling means.

In the concrete example of FIG. 37, the cooling means composed of a container 5106 containing the light valve 5100 and a cooling system connected to the container 5106 and supplying cooling gas. The cooling system is composed of a pump 5107 and a piping 5108 for introducing the cooling gas. Both ends of the piping 5108 are coupled to the container 5106, and function as an introducing port and a discharging port. The discharging port-side of the piping 5108 is attached with a temperature sensor 5109, and a temperature control of the cooling gas is automatically performed by feedback control. For this temperature sensor 5109, for example, a Peltier element can be used. An amount of gas blown by the pump 5107 is controlled depending on an output of the temperature sensor 5109. Finally, the cooling means in the concrete example in FIG. 38, as in the concrete example shown in FIG. 37, is composed of a container 5110 containing the light valve 5100 and a cooling system 5111 coupled to the container 5110 and supplying the cooling gas. A different point from the concrete example in FIG. 37 resides in that both the introducing port and the discharging port of the cooling system 5111 are provided on one lateral surface of the container 5110. In such constitution, the cooling structure of the light valve 5100 can be made compact.

Figure 39:
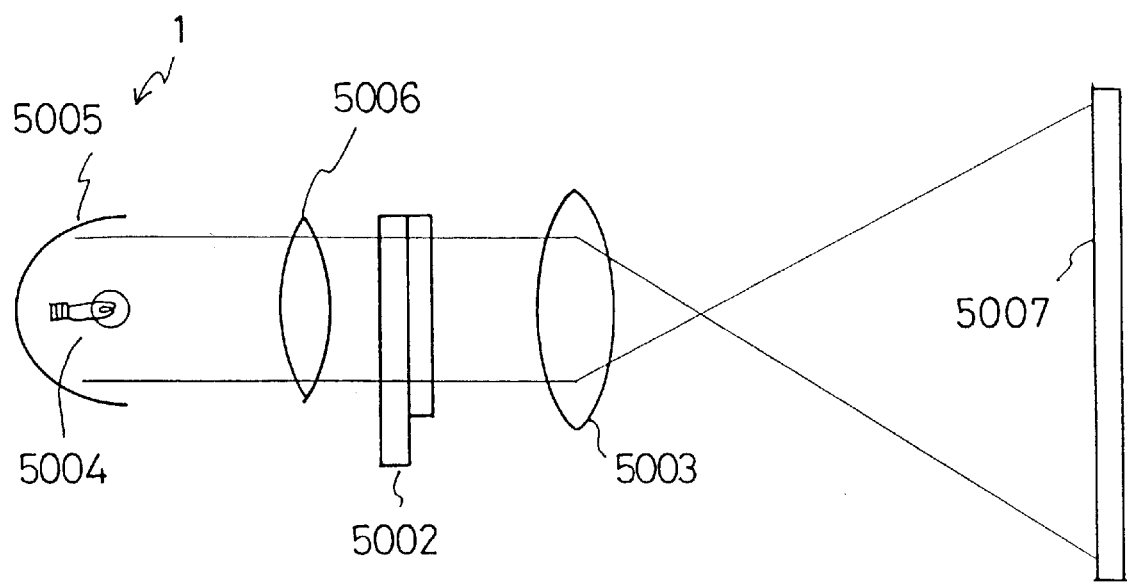
FIG. 39 is a schematic view showing a basical structure of a projector which uses a monocrystalline semiconductor type light valve device according to the present invention.
Figure 40:
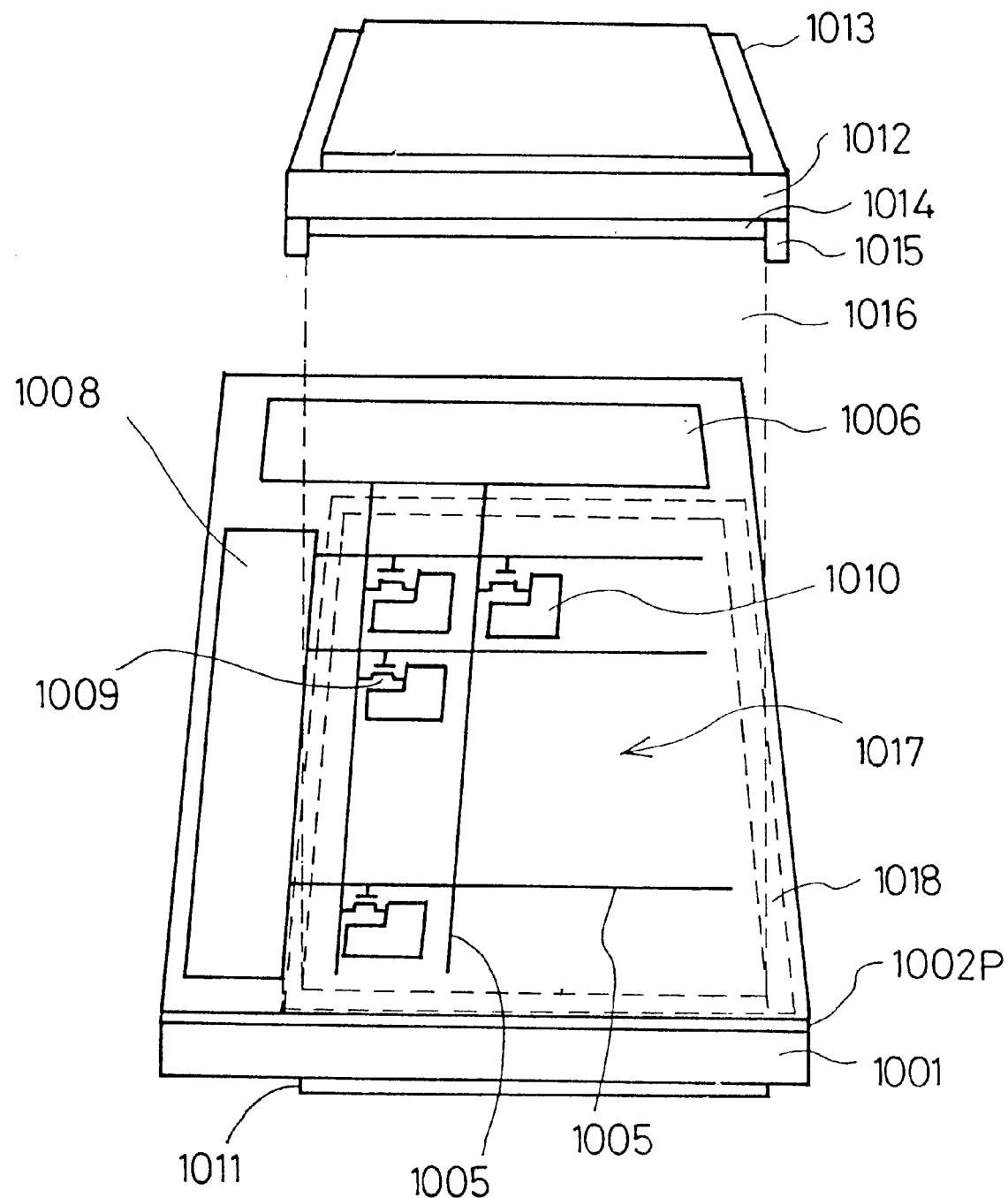
FIG. 40 is a entire view showing one example of the conventional active matrix type liquid crystal display device.

FIG. 39 is a schematic diagram showing a basical structure of a projector according to the present invention.

The projector is composed of a light source section 5001, a light valve 5002, and a projection optical system 5003. The light source unit 5001 includes a lamp 5004 and a reflector 5005, and lights the light valve 5002 through.a condensing lens 5006. The projection optical system 5003 includes an enlargement lens and the like, which enlarges the light passed through the light valve 5002 to project it forwardly, the image is displayed on a screen 5007.

As hereinbefore fully described, for the effects according to the present invention, since the semiconductor fining technique is used for the monocrystalline silicon semiconductor thin layer formed on the glass substrate, display elements can be constituted at a high density on one substrate including not only the pixel electrodes, switching transistors, driving circuits, and peripheral circuits, but also the driving circuits the bight source elements, thus, the display elements and light source elements are formed into one tightly sealed type unitary shape. Therefore, it is unnecessary to mount the peripheral circuits and the driving circuits of light source elements on the other circuit substrate, this exhibits effects such as reduction in the number of connections across the circuits, improvement in reliability due to the tightly sealed construction, advantage on easier handling, and the like, in addition to great improvements in cost reduction miniaturization and thinning.

Thus, for the peripheral circuits section, the control circuit for generating timing signals, display data generating circuit for generating display data, in addition to the driving circuit can be incorporated in one substrate, hence an extremely highly accurate and high-speeded active matrix type image display device can be formed.

Further according to the present invention, the peripheral circuits other than the driving circuits are arranged using a gap space between the driving electrodes from each of X and Y driving circuits, thus the greater effect therefrom is obtained in down-sizing of the first substrate, improvement in the number of pieces obtained from one wafer, and reduction in cost and so forth.

If the present invention is mounted to the wearing device of a helmet type or a hair band type for image stereoscopic vision by both eyes, the stereoscopic image display device can be made wireless, and this eliminates problem of a distance between the device and the image signal source and provides easier handling. Moreover, the display elements and the light source elements can be unitarily formed, it is unnecessary to mount the peripheral circuits and the driving circuits for light source elements on the other substrates, which brings about reduction in the number of connections across the circuits, high reliability due to the tightly sealed construction, advantage on easier handling, and the like in addition to great improvements is cost, reduction miniaturization and thinning.

For example, the monocrystalline semiconductor type image display device according to the invention can directly be connected the outer CCD image pickup element, and is suitable for the view finder of video cameras and the like. The X driving circuits are arranged separately in upper and lower portions relative to the image array section, thus, a transfer speed of shift clock signals for transferring display data is made half than ever to achieve a lower power consumption. The X driving circuit converts digital display data into analog display signals in an output stage to drive the image array section, thereby the image can be reproduced with a high fidelity without attenuation of signal component. The peripheral circuits section such as the driving circuits, control circuits, and display data generating circuits are arranged at four edges of the substrate so as to surround the image array section at a center portion, moreover the seal region is regulated on the peripheral circuit portion of surrounding the image array section so as to be overlapped therewith in horizontal view. Thus, a center position of the image array section is substantially coincident to the center position of the substrate to improve handling on construction and to enable miniaturization and integration. A greater effect is brought about the application thereof can be developed not only for view finders but also for various compact size monitors etc.

According to the invention, the monocrystalline semiconductor type light valve cell, connector terminals, and package members are unitarily formed to produce an IC package construction. Thereby, the light valve cell can be compactly mounted and produces sufficient physical strength. An electric connection can be simplified by incorporating the connector terminals into sockets etc. When the light valve cell is completely sealed by package members, a reliability is improved. Only the image array section of the light valve cell is exposed and the peripheral circuit section is shielded by package member, then a substantially complete shield effect is obtained. A heat radiation means is provided on the package member to produce a cooling effect.

Further the invention constitutes an image projector by using the monocrystalline semiconductor type light valve. In the monocrystalline semiconductor type light valve, the image array section and the peripheral circuit section can be finned more compared to in the active matrix type image display device which uses the conventional monocrystalline semiconductor thin film or amorphous semiconductor thin film, accordingly an extremely highly accurate projection image can be obtained. The light reflection material is used as a shield film for coating the circuit element region of the light valve to effectively suppress temperature rise of the light valve by partially reflecting the light from the light source. The solar cell is formed into a unitary shape in the monocrystalline semiconductor layer to self-supply a power supply voltage to the light valve itself by utilizing energy from the light source. The micro-lens array matching with the pixel section is incorporated to selectively condense the light from the light source only into the pixel section and to improve a brightness of projection image and also to suppress a temperature rise. Furthermore, the cooling means is added to the light valve to suppress a temperature rise caused by light irradiation from the light source.

What is claimed is:

1. A light valve device comprising: a composite substrate comprising a semiconductor monocrystalline thin film mounted on an electrically insulating substrate, the monocrystalline thin film comprising a thinned single crystal semiconductor wafer; a second substrate opposed to and spaced from the composite substrate; an electrooptic material interposed between the composite substrate and the second substrate; a pixel section and a driving circuit section each being formed on the composite substrate, the driving circuit section being formed in the semiconductor monocrystalline thin film and the pixel section including an X electrode group, a Y electrode group crossing the X electrode group, and a thin film transistor formed in the monocrystalline thin film and a pixel electrode both disposed proximate each intersection of respective X electrodes and Y electrodes; wherein the driving circuit section comprises an X electrode driving circuit for supplying display data signals to the X electrode group, a Y electrode driving circuit for supplying scanning signals to the Y electrode group, a control circuit for supplying timing signals to the X electrode driving circuit and the Y electrode driving circuit, and a display data generating circuit for generating display data signals in accordance with an input image signal and for supplying the display data signals to the X electrode driving circuit; wherein the electrooptic material becomes excited when the display data signals and the scanning signals selectively energize the pixel electrodes by activation of respective thin film transistors; and wherein the display data generating circuit comprises an RGB conversion circuit and a synchronization separation circuit, wherein the RGB conversion circuit is operable to receive the input image signal and to output RGB display signals to the X electrode driving circuit, and the synchronization separation circuit is operative to provide synchronization signals to the control circuit.

2. A light valve device as claimed in claim 1, wherein the display data generating circuit comprises an A/D conversion circuit for converting video signals contained in the input image signal into digital video signals and for supplying the digital video signals to the X electrode driving circuit, and wherein the driving circuit section further comprises a D/A conversion circuit for converting the digital video signals into analog display data signals.

3. A light valve device as claimed in claim 1; wherein the display data generating circuit further comprises a timing pulse generating circuit and a video signal processing circuit, the timing pulse generating circuit being operative to generate synchronization signals and to apply the synchronization signals to the video signal processing circuit, and the video signal processing circuit being operative to receive input image signals from an image detecting means and to supply composite video signals to the RGB conversion circuit.

4. A light valve device comprising: a composite substrate comprising a semiconductor monocrystalline thin film adhered to an electrically insulating substrate, the monocrystalline thin film comprising a thinned single crystal semiconductor wafer; a second substrate opposed to and spaced from the composite substrates; an electrooptic material interposed between the composite substrate and the second substrate; a pixel section and a driving circuit section formed in the semiconductor monocrystalline thin film, the pixel section including an X electrode group, a Y electrode group crossing the X electrode group, and a thin film transistor and a pixel electrode both disposed proximate each intersection of respective X electrodes and Y electrodes, and the driving circuit section comprising an X electrode driving circuit for supplying display data signals to the X electrode group, and a Y electrode driving circuit for supplying scanning signals to the Y electrode group; and a display data generating circuit formed on the composite substrate for generating display data signals in accordance with an input image signal and for supplying the display data signals to the X driving circuit, and comprising a color conversion circuit for providing color display signals to the X electrode driving circuit in accordance with an input image signal; wherein the synchronization separation circuit outputs synchronization signals to the control circuit in accordance with the input image signal, and the control circuit outputs timing signals, to the driving circuit section.

5. A light valve device according to claim 4; further comprising a control circuit formed on the composite substrate for providing timing signals to the driving circuit section.

6. A light valve device according to claim 4; further comprising a light source formed on the composite substrate, and light source driving means for driving the light source.

7. A light valve device according to claim 4; wherein the display data generating circuit further comprises analog-to-digital converting means for converting an input analog video signal into a digital video signal, and wherein the driving circuit section includes a digital-to-analog converting means for converting the digital video signal into an analog display data signal.

8. A light valve device according to claim 4; wherein the composite substrate and the second substrate are affixed by means of a seal region to provide a predetermined spacing between the substrates, and the electrooptic material is sealed in the seal region, wherein the seal region overlaps at least part of the driving circuit section formed on the composite substrate.

9. A light valve device according to claim 4; wherein the driving circuit section includes a pair of X electrode driving circuits disposed on opposite sides of the pixel section on the composite substrate.

* * * * *